United States Patent
Katsuragawa et al.

(10) Patent No.: US 12,003,072 B2
(45) Date of Patent: Jun. 4, 2024

(54) Q SWITCH RESONATOR, AND PULSE GENERATOR

(71) Applicant: NICHIA CORPORATION, Anan (JP)

(72) Inventors: Masayuki Katsuragawa, Hachioji (JP); Tetsushi Takano, Yokohama (JP); Hisashi Ogawa, Yokohama (JP)

(73) Assignee: NICHIA CORPORATION, Anan (JP)

( * ) Notice: Subject to any disclaimer, the term of this patent is extended or adjusted under 35 U.S.C. 154(b) by 24 days.

(21) Appl. No.: 17/626,789

(22) PCT Filed: Jun. 19, 2020

(86) PCT No.: PCT/JP2020/024243
§ 371 (c)(1),
(2) Date: Jan. 12, 2022

(87) PCT Pub. No.: WO2021/010089
PCT Pub. Date: Jan. 21, 2021

(65) Prior Publication Data
US 2022/0255283 A1     Aug. 11, 2022

(30) Foreign Application Priority Data

Jul. 16, 2019  (JP) .................... 2019-131456

(51) Int. Cl.
*H01S 3/113*     (2006.01)
*G02F 1/11*     (2006.01)
(Continued)

(52) U.S. Cl.
CPC ............ *H01S 3/10007* (2013.01); *G02F 1/11* (2013.01); *H01S 3/113* (2013.01); *H01S 3/117* (2013.01);
(Continued)

(58) Field of Classification Search
CPC ...... H01S 3/10007; H01S 3/113; H01S 3/117; H01S 3/121; H01S 5/02208;
(Continued)

(56) References Cited

U.S. PATENT DOCUMENTS 3,900,247 A  *  8/1975  Zaky ...................... G02F 1/03
                                                      359/247
5,652,756 A        7/1997  Stultz et al.
(Continued)

FOREIGN PATENT DOCUMENTS

EP       2 849 293 A1    3/2015
JP       H04-171780 A    6/1992
(Continued)

OTHER PUBLICATIONS

Bader et al., "Efficient coupling to an optical resonator by exploiting time-reversal symmetry", New Journal of Physics, Dec. 6, 2013, pp. 1-10, vol. 15, 123008, IPO Publishing Ltd and Deutsche Physikalische Gesellschaft.

*Primary Examiner* — Xinning(Tom) Niu
(74) *Attorney, Agent, or Firm* — Foley & Lardner LLP

(57) ABSTRACT

A Q switch resonator includes: an optical resonator comprising at least two mirrors, and configured to accumulate power of a continuous wave or an intermittent continuous wave incident from an outside; and a switching element provided in the optical resonator. The switching element is configured such that, when the power accumulated in the optical resonator increases to a predetermined level, the switching element outputs an optical pulse by lowering a Q factor from a first level to a second level lower than the first level.

24 Claims, 22 Drawing Sheets

(51) Int. Cl.
*H01S 3/10* (2006.01)
*H01S 3/117* (2006.01)
*H01S 3/121* (2006.01)
*H01S 5/02208* (2021.01)
*H01S 5/065* (2006.01)

(52) U.S. Cl.
CPC .......... *H01S 3/121* (2013.01); *H01S 5/02208* (2013.01); *H01S 5/0651* (2013.01)

(58) Field of Classification Search
CPC .......... H01S 5/0651; H01S 3/10; H01S 5/022; H01S 5/065; G02F 1/11; G02F 1/3523; G02F 1/03; G02F 2203/52; G02F 1/01; G02B 26/02
See application file for complete search history.

(56) References Cited

U.S. PATENT DOCUMENTS

| | | | |
|---|---|---|---|
| 5,675,596 A * | 10/1997 | Kong | H01S 3/113 372/99 |
| 9,793,677 B1 * | 10/2017 | Jhon | H01S 3/127 |
| 2002/0018630 A1 * | 2/2002 | Richardson | G02B 6/03666 359/341.1 |
| 2004/0100998 A1 * | 5/2004 | Palmer | H01S 3/082 372/9 |
| 2006/0165145 A1 * | 7/2006 | Krupke | H01S 3/09415 372/18 |
| 2008/0095201 A1 * | 4/2008 | Mu | H01S 3/117 372/10 |
| 2008/0101423 A1 * | 5/2008 | Mirov | H01S 3/163 438/45 |
| 2008/0304137 A1 * | 12/2008 | Kakui | H04B 10/2935 359/341.3 |
| 2013/0242380 A1 * | 9/2013 | Tsigutkin | H01S 3/117 359/337 |

FOREIGN PATENT DOCUMENTS

| | | |
|---|---|---|
| JP | H08-064897 A | 3/1996 |
| JP | H11-068213 A | 3/1999 |
| JP | 2011-114268 A | 6/2011 |
| JP | 2011114268 * | 6/2011 |
| WO | WO-2017/171595 A1 | 10/2017 |

* cited by examiner (A) CAUSE INCIDENCE OF CW
(OR INTERMITTENT CW) LIGHT (S1)

(B) ACCUMULATE LIGHT IN RESONATOR (S2)

(C) RELEASE OPTICAL PULSE (S3)

(A) MECHANICAL Q SWITCH (B) ACOUSTIC Q SWITCH (C) ELECTRO-OPTICAL Q SWITCH (A) $A_Q^{(2)}$ (B) POWER IN SECOND STAGE RESONATOR (C) SECOND STAGE RESONATOR OUTPUT (A) SECOND STAGE $A_Q^{(2)}$ (B) POWER IN SECOND STAGE RESONATOR (C) SECOND STAGE RESONATOR OUTPUT (A) FIRST STAGE $A_Q^{(1)}$ (B) Q FACTOR OF FIRST STAGE RESONATOR (C) POWER IN FIRST STAGE RESONATOR (D) FIRST STAGE RESONATOR OUTPUT (A) SECOND STAGE $A_Q^{(2)}$ (B) POWER IN SECOND STAGE RESONATOR (C) SECOND STAGE RESONATOR OUTPUT (A) FIRST STAGE $A_Q^{(1)}$ (B) Q FACTOR OF FIRST STAGE RESONATOR (C) POWER IN FIRST STAGE RESONATOR (D) FIRST STAGE RESONATOR OUTPUT (A) SECOND STAGE $A_Q^{(2)}$ (B) POWER IN SECOND STAGE RESONATOR (C) SECOND STAGE RESONATOR OUTPUT

Q SWITCH RESONATOR, AND PULSE GENERATOR

CROSS-REFERENCE TO RELATED APPLICATIONS

This application is a national stage of PCT Application No. PCT/JP2020/024243, filed on Jun. 19, 2020, which claims priority to Japanese Application No. 2019-131456, filed on Jul. 16, 2019. The contents of these applications are hereby incorporated by reference in their entireties.

BACKGROUND

The present invention relates to a Q switch resonator and a pulse generator.

A Q-switch laser is a pulse laser configured to convert energy accumulated as a population inversion in a gain medium into an optical pulse having high energy by switching a Q factor of a laser resonator from low to high and to output the optical pulse. While the population inversion is being created in the gain medium in the resonator, the Q factor is maintained low in order to prevent laser oscillation and loss of the population inversion. When a sufficiently large population inversion is reached in the gain medium, the Q factor is increased to cause pulse oscillation.

A Q-switch carbon dioxide gas laser (for example, see JP H8-64897 A) using carbon dioxide gas as a gain medium, a solid state laser device (for example, see JP H4-171780 A) using a neodymium doped YAG crystal, and the like have been known.

It is also known that, upon incidence of pulse light on an optical resonator, when the incident light has a waveform indicating an exponential increase that matches a life of the resonator and has a pulse waveform that instantly becomes 0 at peak power, coupling efficiency to the resonator is maximized (for example, see New Journal of Physics Vol. 15 123008 (2013)).

Meanwhile, technologies of a continuous wave (CW) laser and an intermittent CW laser having high average power, such as a semiconductor laser and a fiber laser, have been developed. In particular, semiconductor lasers, being small and inexpensive, having low power consumption, and being configured to oscillate at a desired wavelength, have been widely used.

SUMMARY

A laser with a short excitation life, such as a semiconductor laser, cannot sufficiently store energy and is not suitable for normal Q switch pulse oscillation. Also, in terms of light damage to a laser medium, it is difficult to extract an optical pulse having high peak power. An efficient pulse-extraction configuration is desired.

An object of the present invention is to provide a Q switch resonator that achieves efficient pulse extraction, and a pulse generator using the Q switch resonator.

An optical resonator is used separately from a laser medium, light is accumulated in the resonator, and a Q factor is switched from a high value to a low value to output an optical pulse.

In a first aspect of the present invention, a Q switch resonator includes an optical resonator formed of at least two mirrors, and configured to accumulate power of a continuous wave or an intermittent continuous wave incident from an outside, and a switching element provided in the optical resonator. When the power accumulated in the optical resonator increases to a predetermined level, the switching element outputs an optical pulse by lowering a Q factor from a first level to a second level lower than the first level.

In a second aspect of the present invention, a pulse generator includes a first optical resonator, and a light source configured to cause a continuous wave or an intermittent continuous wave to be incident on the first optical resonator. The first optical resonator includes a first switching element, and, when power of light incident on the first optical resonator increases to a predetermined level, the first switching element outputs an optical pulse by lowering a Q factor of the first optical resonator from a first level to a second level lower than the first level.

With the configuration described above, an optical pulse can be extracted efficiently.

DETAILED DESCRIPTION

In an embodiment, a pulse output having high peak power is generated by externally pulsing an output of a CW laser (including an intermittent CW laser). To achieve this, a resonator is provided separately from the laser, light is accumulated in the resonator, and a Q factor of the resonator is switched from a high value to a low value to output a pulse having high energy.

<Basic Principle>

Figure 1:
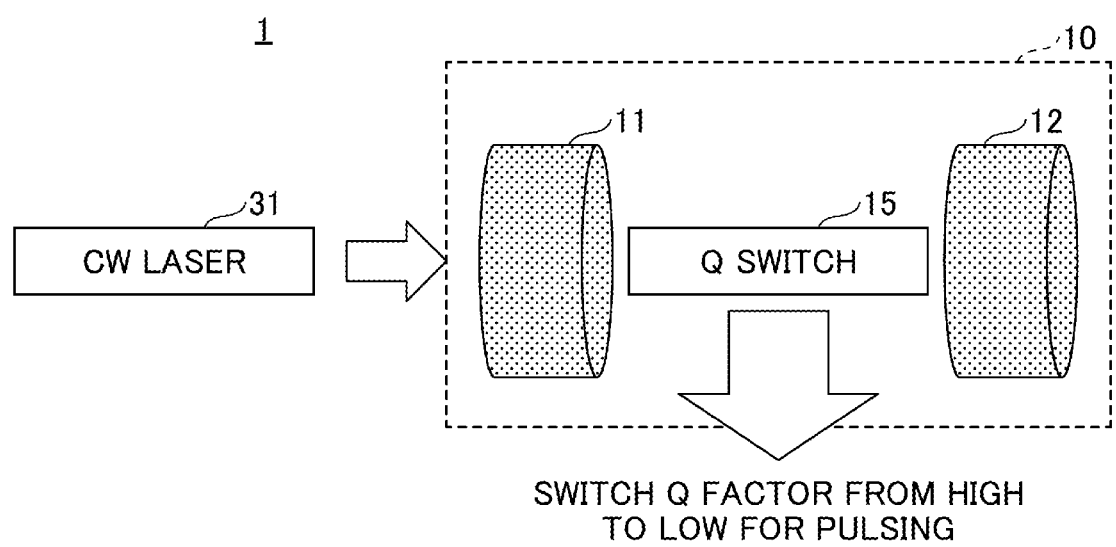
FIG. 1 is a basic configuration diagram of the present invention.

FIG. 1 is a basic configuration diagram of the present invention. A pulse generator 1 includes a CW laser 31 as a light source, and a Q switch resonator 10. The CW laser 31 is configured to output a continuous wave or an intermittent continuous wave. The continuous wave or the intermittent continuous wave output from the CW laser 31 is incident on the Q switch resonator 10 and amplified.

The Q switch resonator 10 includes at least two mirrors 11 and 12, and a Q switch 15 being a switching element. The mirror 11 and the mirror 12 form an optical resonator. Unlike a conventional Q switch laser, the Q switch resonator 10 does not contain a laser medium or a gain medium in the resonator.

The incident continuous wave or intermittent continuous wave from the outside is repeatedly reflected and amplified between the mirror 11 and the mirror 12, and light energy is accumulated in the optical resonator. While the light energy is accumulated, a Q factor of the resonator is maintained high. When the power accumulated in the resonator becomes equal to or higher than a certain level, the Q factor is switched to a low side to release the accumulated power.

The Q factor is a dimensionless amount representing a continuous characteristic of oscillation of a resonant system, and is generally expressed in a ratio of an oscillation frequency to a line width (a full width half maximum (FWHM)) of a resonant frequency. The higher the Q factor, the more stably the system resonates, and the greater the energy therein.

When the energy in the resonator becomes sufficiently high, the Q switch 15 releases energy at once to reduce the Q factor. Thus, an optical pulse having high energy is output from the resonator.

This configuration is fundamentally different from a configuration of a general Q switch laser, i.e., a configuration in which a Q factor is maintained low while light energy is being accumulated in a gain medium, and the Q factor is increased for oscillation when the energy has been stored.

Figure 2:
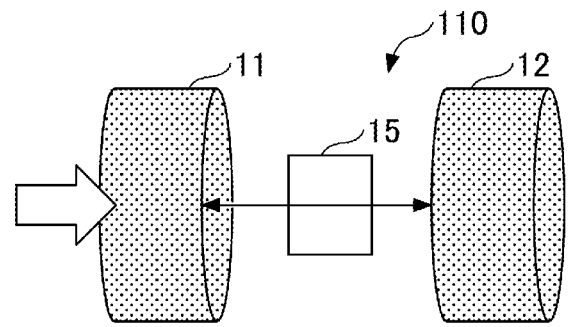
FIGS. 2A to 2C are diagrams illustrating principles of the present invention.
Figure 2:
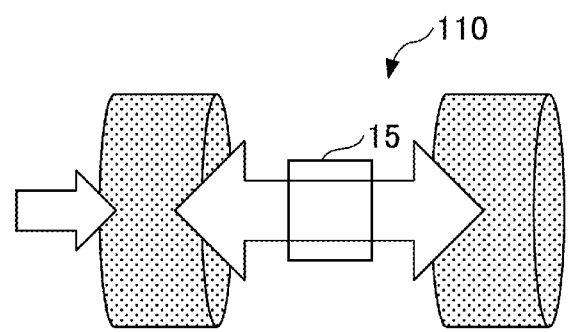
Figure 2:
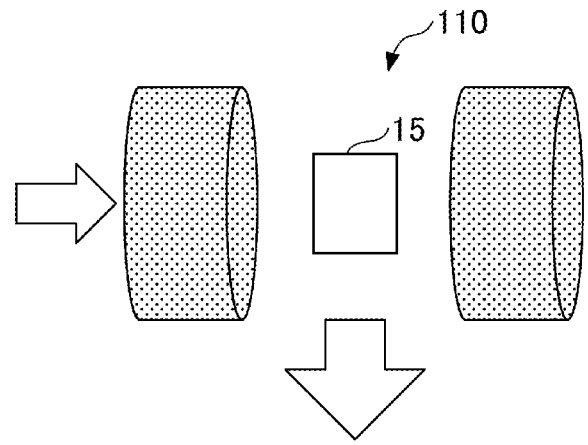

FIGS. 2A to 2C are diagrams illustrating principles of the present invention. In FIG. 2A, CW light or intermittent CW light (hereinafter simply referred to as "CW light") incident on an optical resonator 110 from the outside is repeatedly reflected between the mirror 11 and the mirror 12 multiple times (S1). In FIG. 2B, an increase in the number of repetitions of reflection of the light between the mirror 11 and the mirror 12 causes an increase in energy accumulated in the optical resonator 110 (S2). In FIG. 2C, when the energy in the optical resonator 110 becomes sufficiently high, the Q factor is switched from high to low to release an optical pulse (S3).

Figure 3:
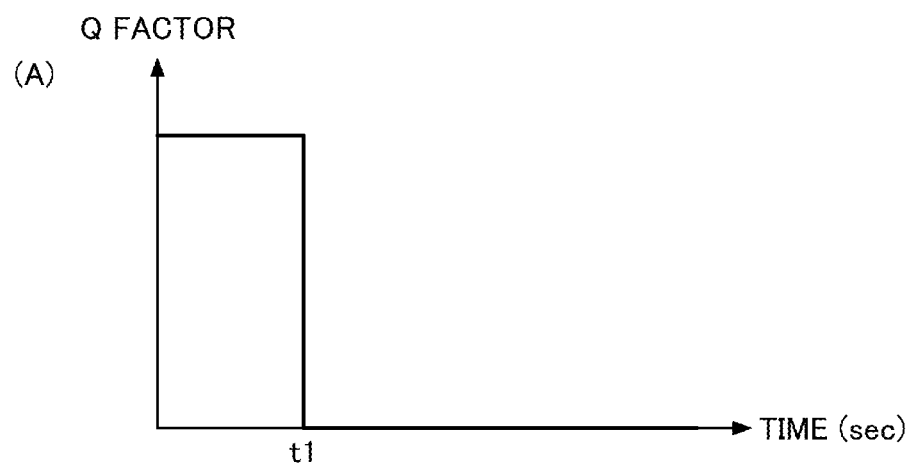
FIGS. 3A to 3C are graphs illustrating characteristics of an optical resonator.
Figure 3:
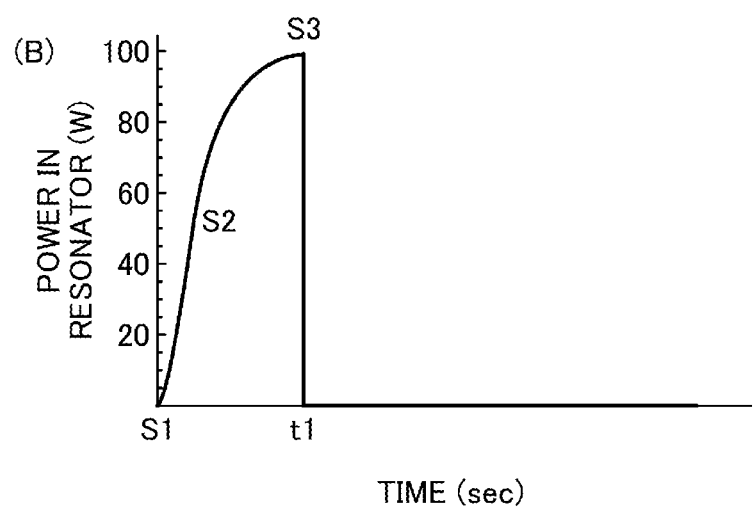
Figure 3:
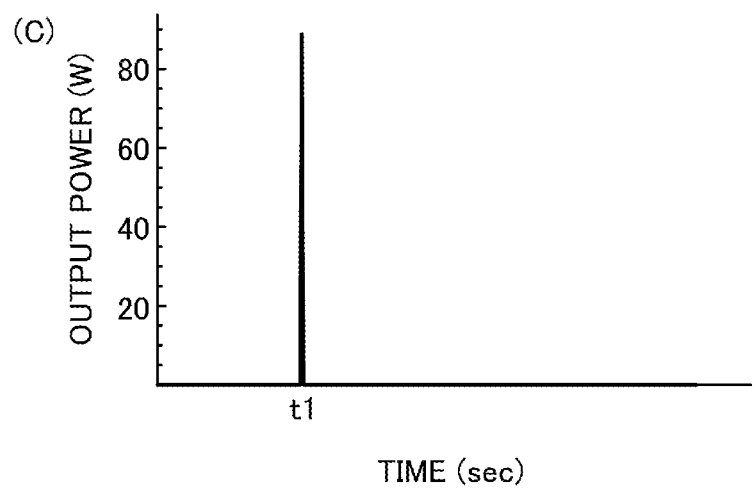

FIGS. 3A to 3C are graphs illustrating characteristics of the optical resonator 110. Provided that the CW light is incident at time 0, an optical pulse is output at time t1. In FIG. 3A, the Q factor is maintained high until the time t1. Accordingly, the light stably repeatedly reflects or oscillates in the optical resonator 110. At the time t1, the Q factor is switched to zero.

FIG. 3B shows a profile of power in the resonator. Energy is gradually accumulated in the resonator from the incidence of the CW light until the time t1. The origin corresponds to S1 in FIG. 2A, and the process of power increase corresponds to S2 in FIG. 2B. When the power reaches a constant level at the time t1, the power decreases at once by switching of the Q switch 15. This point in time corresponds to S3 in FIG. 2C.

FIG. 3C shows a profile of output power. There is no output from the resonator until the time t1, and a sharp short pulse is output at the time t1.

In the basic configuration in FIG. 1, a gain medium is not disposed in the resonator, and thus the problem of light damage is avoided. Sufficient energy can be accumulated in the optical resonator 110 by repeated reflection of the light between the mirror 11 and the mirror 12, and an optical pulse having high peak power can be extracted.

First Embodiment

Figure 4:
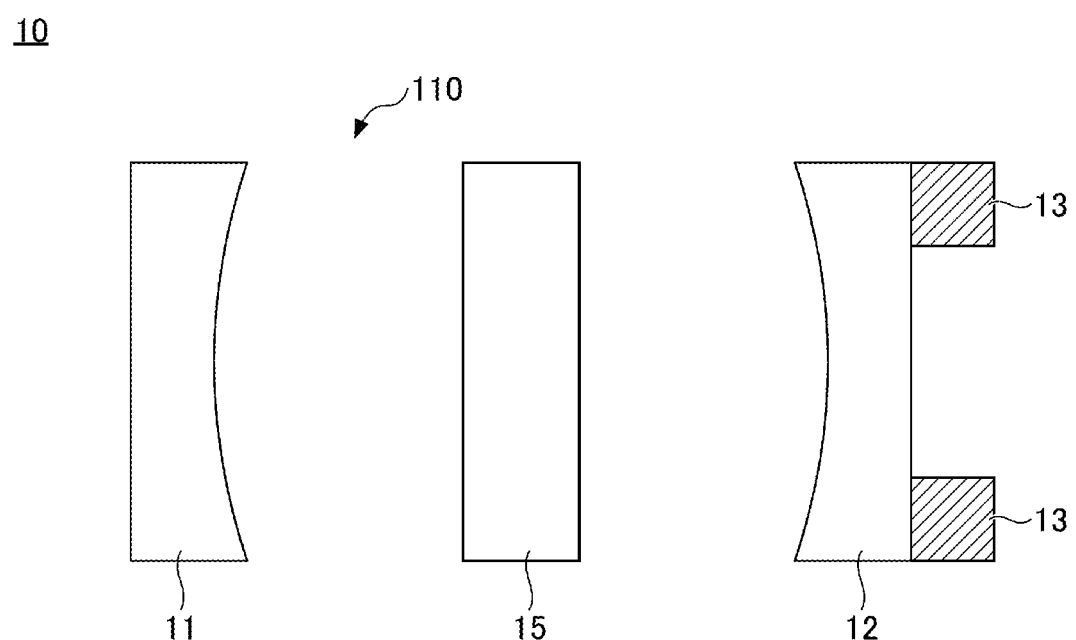
FIG. 4 is a schematic diagram of a Q switch resonator according to a first embodiment.

FIG. 4 is a schematic diagram of the Q switch resonator 10 according to a first embodiment. The Q switch resonator 10 includes the mirror 11 and the mirror 12 that constitute the optical resonator 110, and the Q switch 15. At least one of the mirror 11 and the mirror 12 may be provided with an actuator 13 for adjusting a resonator length.

The mirror 11 and the mirror 12 are disposed such that light having made a round-trip in the resonator overlaps an original optical path. A power transmittance of the light when having made a round-trip in the resonator is $A_{RT}$.

The Q factor of the resonator is defined as $Q=f/\Delta f=F/L\lambda$.

Herein, f represents a center frequency of a frequency spectrum, $\Delta f$ represents an FWHM of the frequency spectrum, F represents a finesse, which is a resolution of the frequency spectrum, L is a length of a single round-trip of the resonator, and $\lambda$ is a wavelength of the light.

The finesse F is defined as $F \equiv \pi(A_{RT})^{0.25}/[1-(A_{RT})^{0.5}]$.

The actuator 13 is used to set a resonator length in a single round-trip to be an integral multiple of the wavelength $\lambda$ of the light. For example, a piezoelectric element or the like, for example, can be used for the actuator 13.

The Q switch 15 is provided in the optical resonator 110. The Q switch 15 is used to control the finesse F by changing an attenuation, i.e., a transmittance $A_Q$ of the light, and is also used to extract an optical pulse. Among characteristics of the Q switch 15, a response speed $\tau_Q$ and a maximum transmittance $A_Q^{MAX}$ have great significance. The response speed $\tau_Q$ is preferably faster, and the maximum transmittance $A_Q^{MAX}$ is preferably higher.

Figure 5:
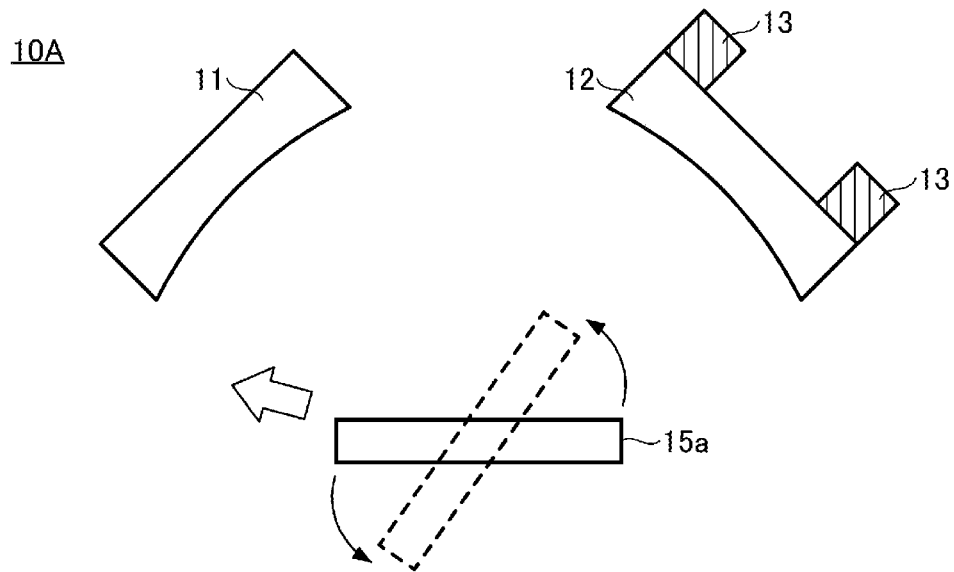
FIGS. 5A to 5C are diagrams illustrating configuration examples of a Q switch.
Figure 5:
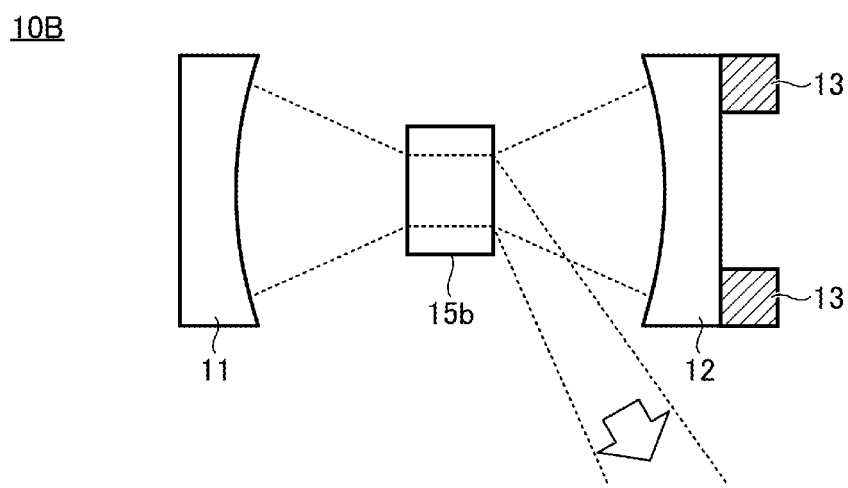
Figure 5:
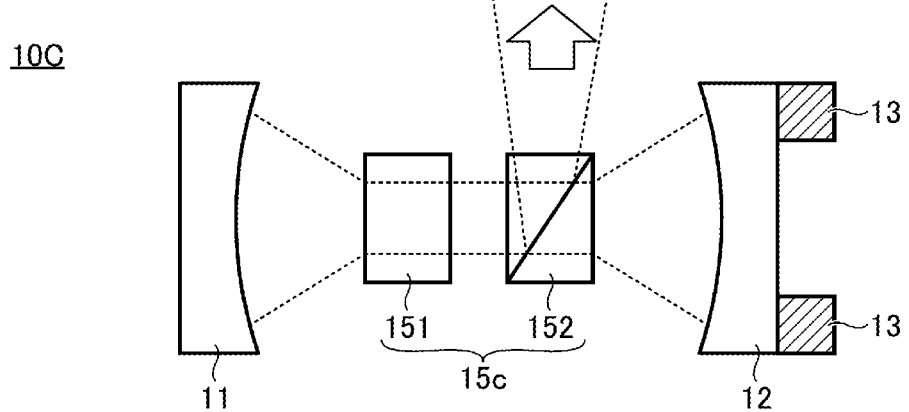

FIGS. 5A to 5C are configuration examples of the Q switch 15. A Q switch resonator 10A in FIG. 5A uses a mechanical Q switch 15a. Example of the mechanical Q switch 15a include a rotatable mirror, with which a pulse is output to the outside of the resonator by mechanically changing an angle of the mirror. This configuration is used for an application that does not require a high response speed $\tau_Q$ (approximately milliseconds). The maximum transmittance $A_Q^{MAX}$ can be set equal to or greater than 99.9% depending on an arrangement.

A Q switch resonator 10B in FIG. 5B uses an acoustic Q switch 15b. At a timing of a pulse output, an ultrasonic wave is applied to a crystal to excite a phonon of the crystal, thus causing light to be diffracted. While the response speed $\tau_Q$ is relatively fast (several-hundred nanoseconds), the maximum transmittance $A_Q^{MAX}$ is approximately 95%.

A Q switch resonator 10C in FIG. 5C uses an electro-optical Q switch 15c. The electro-optical Q switch 15c includes, for example, a combination of an electro-optical crystal 151 and a polarizing beam splitter (PBS) 152. A voltage, a current, an electric signal, or the like is applied to the electro-optical crystal 151 to rotate polarized light by using an electro-optical effect, and any one of polarization components is extracted by the PBS 152. The response speed $\tau_Q$ is very fast (several nanoseconds), and the maximum transmittance $A_Q^{MAX}$ is approximately 99%.

The Q switch 15 is not limited to these examples, and a magnetic body switch or the like may be used for the Q switch 15. Further, when only the mirror 11 and the mirror 12 constitute an optical resonator, a Q switch may be obtained by setting either one of the mirrors to be variable in reflectance. A Q switch suitable for an application can be selected according to characteristics such as the response speed $\tau_Q$ and the maximum transmittance $A_Q^{MAX}$.

Figure 6:
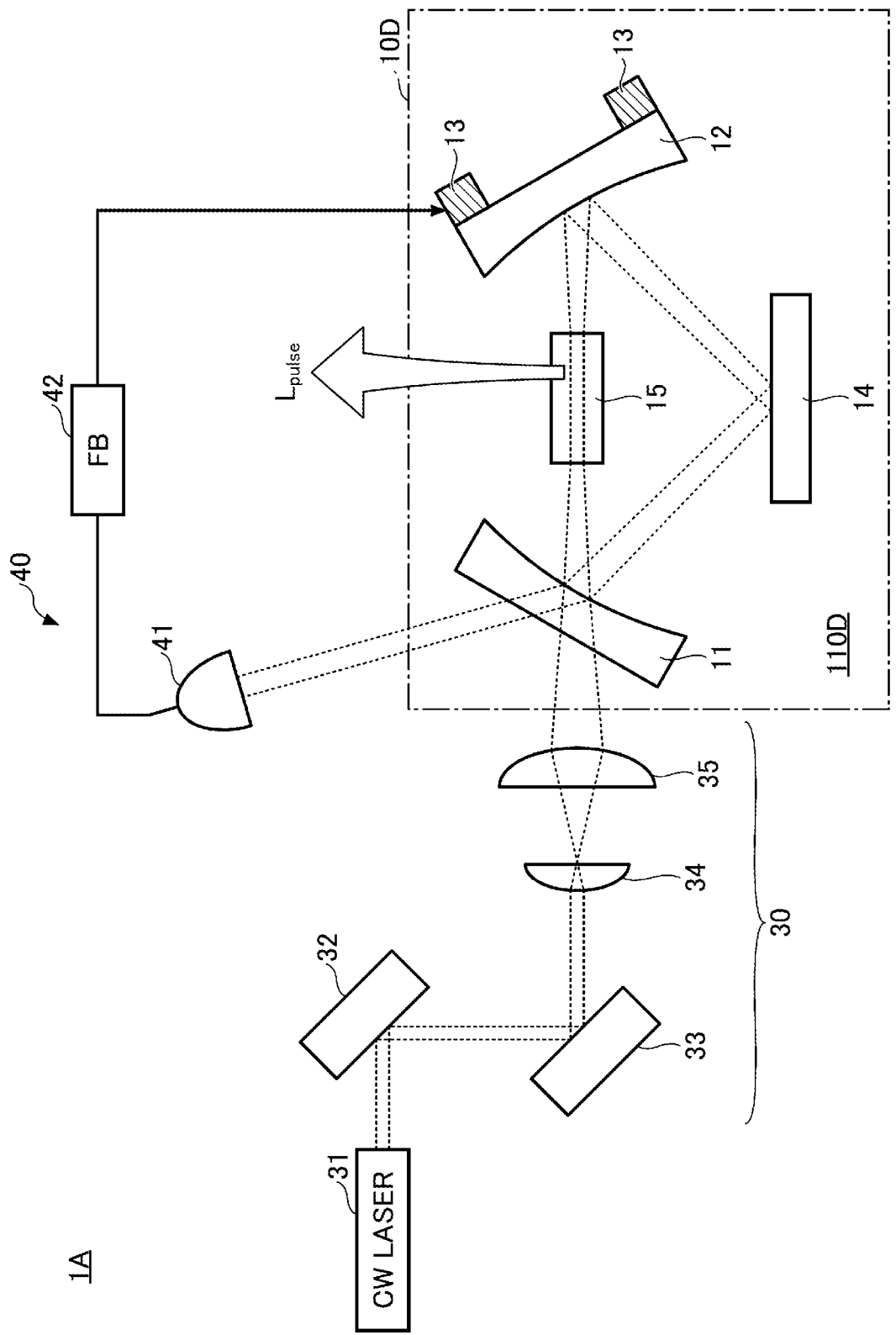
FIG. 6 is a schematic diagram of a pulse generator according to the first embodiment.

FIG. 6 is a configuration example of a pulse generator 1A according to the first embodiment. The pulse generator 1A includes a CW laser 31 as an external light source, and a Q switch resonator 10D. In this example, the Q switch resonator 10D includes a triangular ring optical resonator 110D using three mirrors 11, 12, and 14, and a Q switch 15 provided in the optical resonator 110D.

An optical system 30 for adjustment such that lateral modes of the CW laser 31 and the optical resonator 110D coincide with each other may be used. A feedback system 40 for coinciding a resonator length of the optical resonator 110D with an integral multiple of a wavelength of the CW laser 31 may also be used.

The CW laser 31 is a single longitudinal/lateral mode laser configured to perform continuous oscillation or pseudo-continuous oscillation (continuous oscillation time of micro seconds or longer). In one example, a semiconductor laser having a wavelength of 450 nm is used. An output beam of the CW laser 31 is assumed to be beam-shaped.

The optical system 30 for a lateral mode adjustment includes, for example, a mirror 32, a mirror 33, a lens 34, and a lens 35. Arrangements other than this example arrangement may be employed. By appropriately disposing an appropriate optical element, a lateral mode of laser light incident on the Q switch resonator 10D can be adjusted.

When the CW laser 31 operates in single lateral mode, an intensity distribution of light in a cross section orthogonal to an optical axis is a Gaussian distribution ($TEM_{00}$ mode). Both the intensity distribution (horizontal lateral mode) in a horizontal direction and the intensity distribution (vertical lateral mode) in a vertical direction of this cross section preferably coincides the lateral mode distribution of light resonating in the optical resonator 110D.

The lateral modes of the CW laser 31 and the optical resonator 110D may coincide with each other by appropriately designing and arranging the CW laser 31 and the optical resonator 110D without using the optical system 30 for a lateral mode adjustment.

The feedback system 40 configured to match a frequency of the CW laser 31 with a resonance frequency of the optical resonator 110D includes a photodetector 41 and a feedback circuit 42. The photodetector 41 is configured to detect interference light of a portion of incident light reflected at the mirror 11 and a portion of light that makes a round-trip in the optical resonator 110D and to convert the detected lights into electric signals. The feedback circuit 42 specifies, from the electric signal, a difference between the frequency of the CW laser 31 and the resonance frequency of the optical resonator 110D, and feeds back the difference information to the optical resonator 110D or the CW laser 31.

In the configuration example in FIG. 6, difference information about a longitudinal mode is fed back to the actuator 13 of the optical resonator 110D. The actuator 13 is configured to perform a fine adjustment to a position of the mirror 12 to adjust a resonator length (a length of a round-trip of light). The difference information may be fed back to the CW laser 31 instead of the actuator 13.

While a portion of light that makes a round-trip in the resonator is extracted from the mirror 11 and monitored by the photodetector 41 in the configuration in FIG. 6, a portion of the light having made a round-trip may be extracted from the mirror 12 or the mirror 14 and compared with a longitudinal mode of incident light. In such a case, a reflectance of the mirrors 11, 12, and 14 that constitute the optical resonator is appropriately adjusted.

FIGS. 7A to 7D are graphs illustrating resonator characteristics of the first embodiment. Parameters of a simulation are set as follows:

The CW laser 31 has a power of 1 W, and a wavelength of 450 nm.

A length of a round-trip of the optical resonator 110D is 3 m, a reflectance of the mirror 11 is 98.8%, a reflectance of the mirror 12 is 99.9%, and a reflectance of the mirror 14 is 99.9%.

The Q switch 15 has a maximum transmittance $A_Q^{MAX}$ of 99%, and a response speed $\tau_Q$ of 1 nanosecond.

In this condition, a round-trip resonator length (length of a round-trip) is an integral multiple of a laser wavelength. A calculation starts from a state in which power in the resonator is 0.

Figure 7:
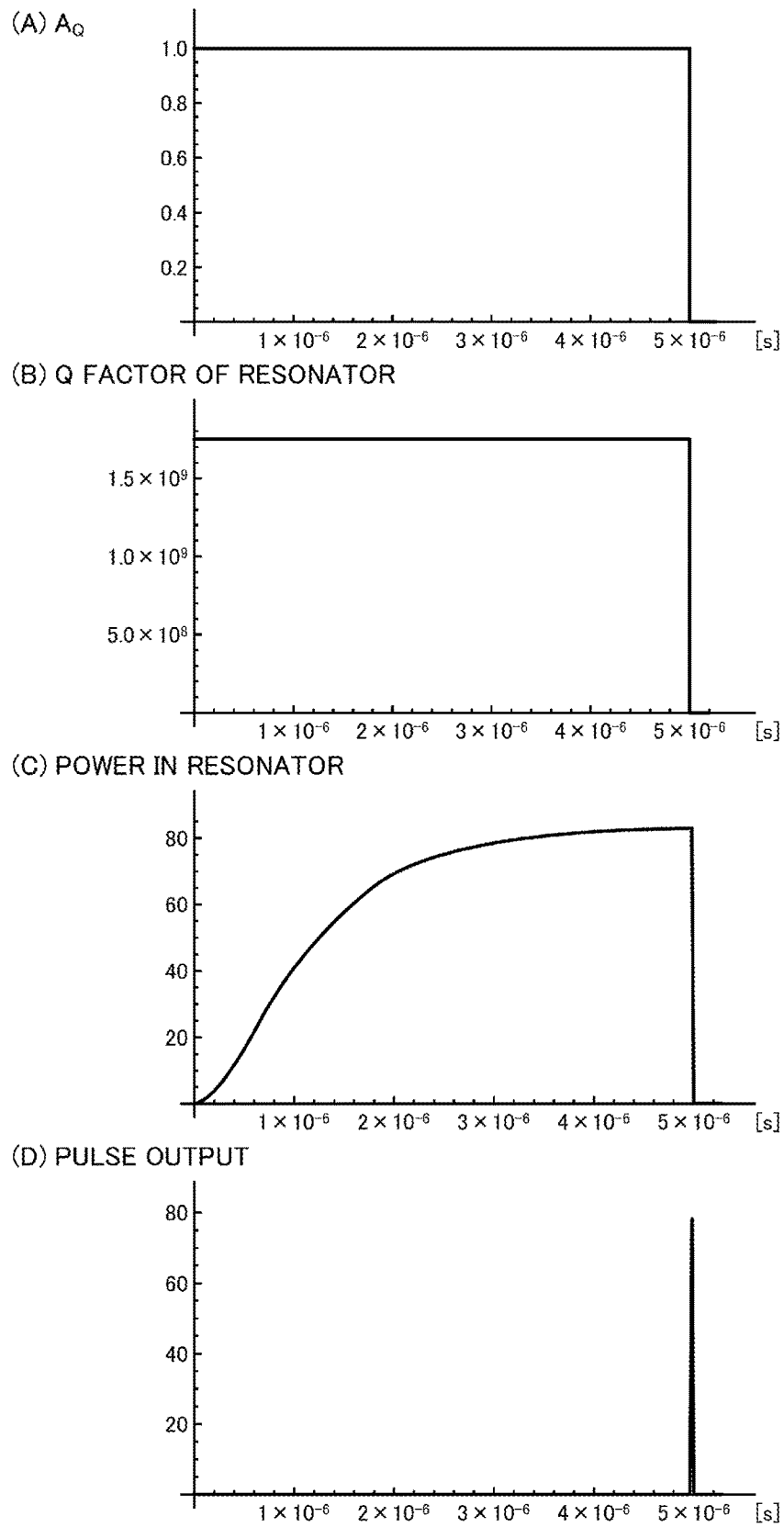
FIGS. 7A to 7D are graphs illustrating resonator characteristics of the first embodiment.

FIG. 7A illustrates a transmittance $A_Q$, FIG. 7B illustrates a Q factor of the resonator, FIG. 7C illustrates power in the resonator, and FIG. 7D illustrates a pulse output. An initial value of $A_Q$ is the maximum value $A_Q^{MAX}$ ($A_Q^{MAX}=0.99$), and the Q factor is set high.

The power in the resonator gradually increases simultaneously with a start of incidence. When the power in the resonator approaches a steady value (approximately 5 microseconds), the $A_{Q\ factor}$ is lowered to 0 for a time of about 1 nanosecond to extract pulse light. The Q factor of the resonator and the power in the resonator decrease at once, and a pulse output is obtained.

Figure 8:
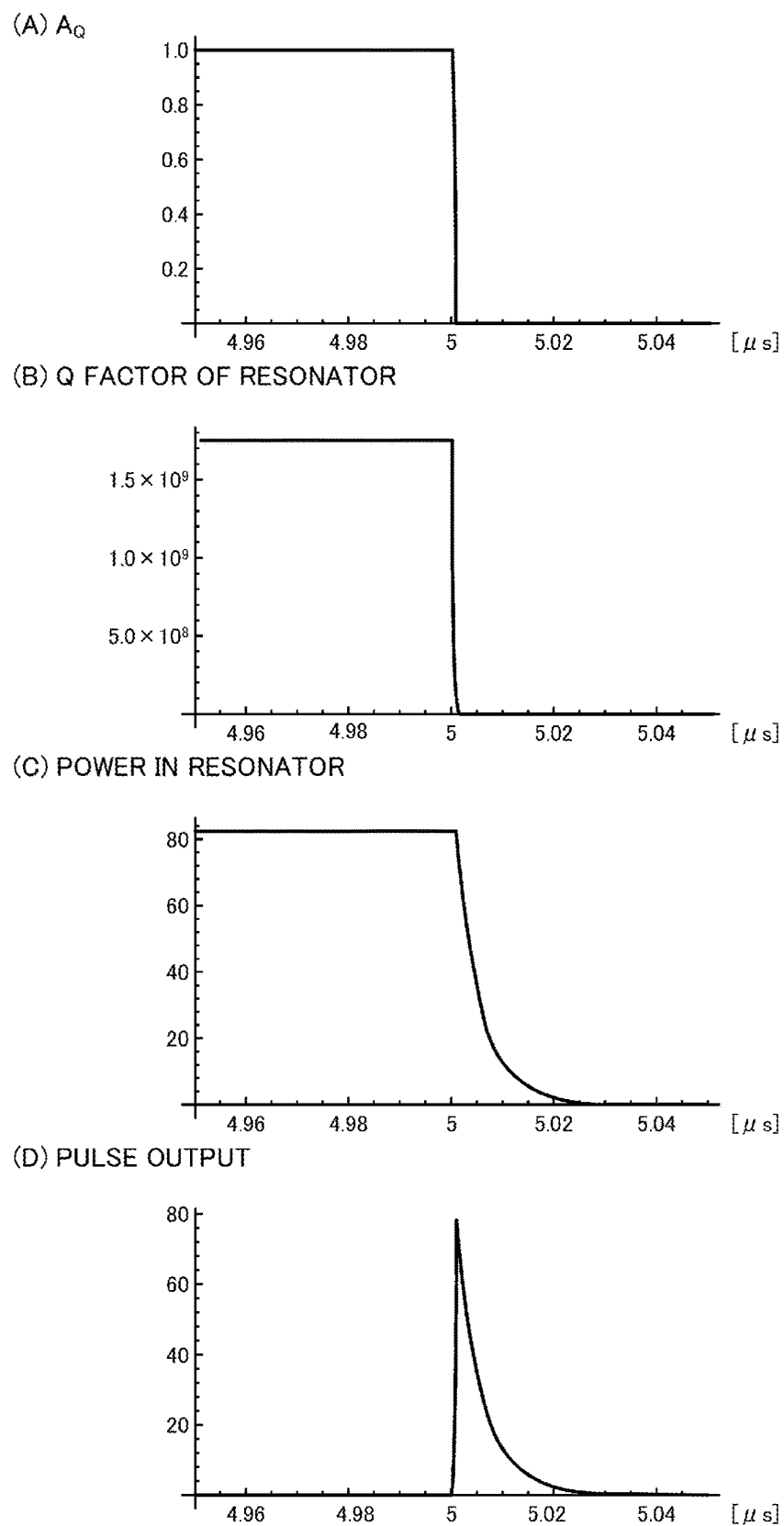
FIGS. 8A to 8D are enlarged views near pulse output points in FIGS. 7A to 7D.

FIGS. 8A to 8D are enlarged views near 5 microseconds in FIGS. 7A to 7D. Corresponding to FIGS. 7A to 7D, FIG. 8A illustrates a transmittance $A_Q$, FIG. 8B illustrates a Q factor of the resonator, FIG. 8C illustrates power in the resonator, and FIG. 8D illustrates a pulse output. Immediately after switching of the Q switch, i.e., immediately after switching of the $A_{Q\ factor}$, a maximum pulse output of 79 W is obtained, and becomes a half value after about 4.2 nanoseconds from obtaining the maximum pulse output. The input power from the CW laser 31 is 1 W, so that the Q switch resonator 10 achieves a 79-fold increase in peak power.

The peak power of the output pulse is proportional to the optical power (incident light×enhancement factor) amplified in the resonator. Therefore, the higher the power transmittance $A_{RT}$ when the light has made a round trip in the resonator, the greater the peak power, but the power transmittance $A_{RT}$ is limited by the maximum transmittance $A_Q^{MAX}$. On the other hand, a pulse width is determined by time of round-trip of light in the resonator in a range in which a response speed of the Q switch is high. Then, an area of a pulse waveform represents output energy, and in the first embodiment, an optical pulse having high power and a short pulse width can be generated from the CW light by using the Q switch resonator 10. An optical pulse having higher energy and a longer pulse width can be generated when using a longer resonator.

Second Embodiment

Figure 9:
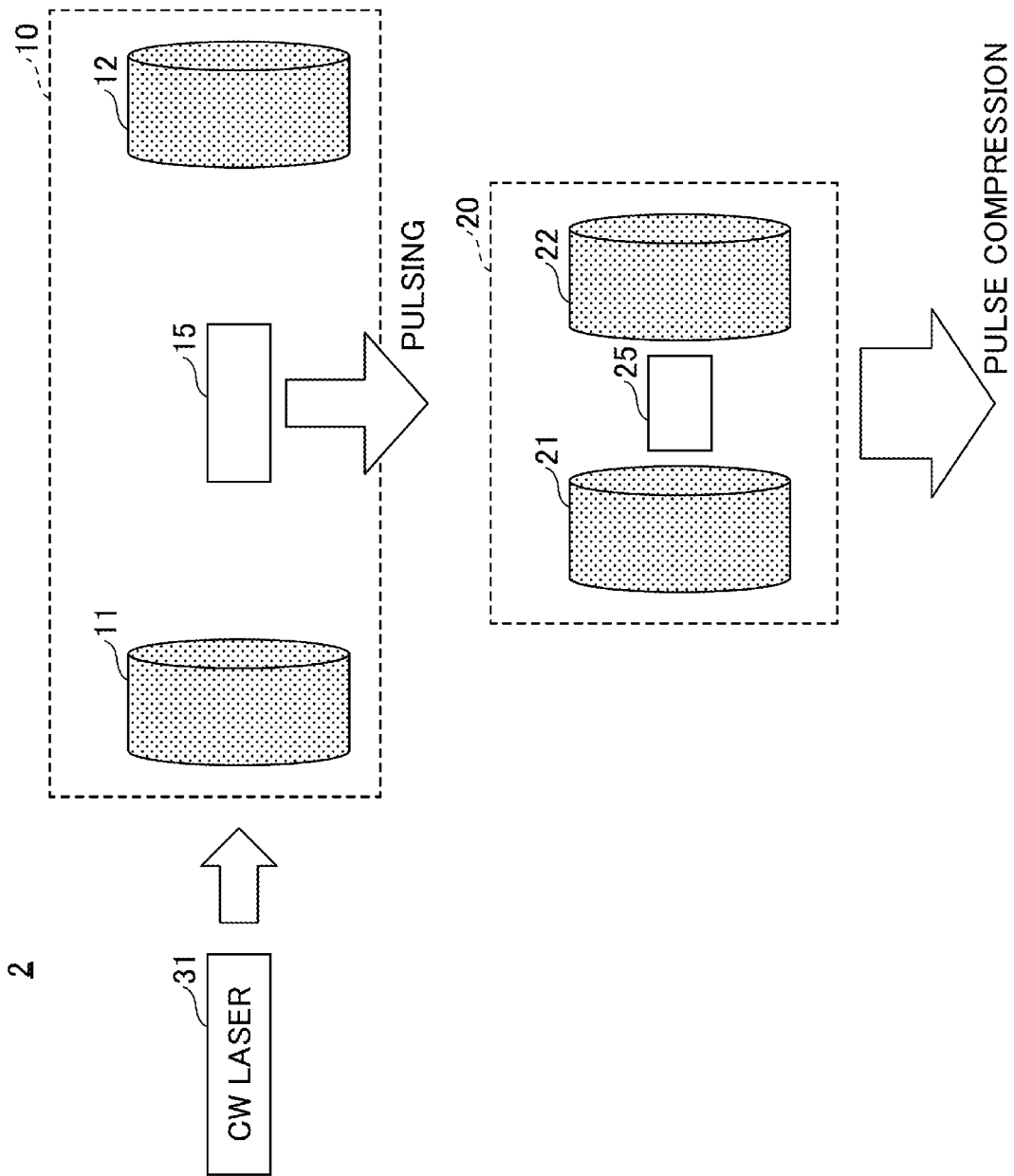
FIG. 9 is a basic configuration diagram of a pulse generator according to a second embodiment.

FIG. 9 is a schematic diagram illustrating a basic configuration of a pulse generator 2 according to a second embodiment. In the second embodiment, Q switch resonators are arranged in series, and an output pulse of a Q switch resonator 10 in a first stage is accumulated in a Q switch resonator 20 in a second stage for pulse compression to acquire higher peak power.

Similar to the first embodiment, the Q switch resonator 10 includes a mirror 11, a mirror 12, and a Q switch 15. The mirror 11 and the mirror 12 are disposed such that light having made a round-trip in the resonator overlaps an original optical path.

The Q switch resonator 20 in the second stage includes a mirror 21, a mirror 22, and a Q switch 25. The mirror 21 and the mirror 22 are disposed such that light having made a round-trip in the resonator overlaps an original optical path.

As described above, peak power of an output pulse is determined by input light and an enhancement factor. Then, the enhancement factor is limited by a maximum transmittance of the Q switch. Therefore, in order to obtain a higher peak power, the input light needs to be further increased. Thus, a pulse is compressed by generating a wide pulse in the Q switch resonator 10 in the first stage having a long resonator length, accumulating the first stage pulse in the Q switch resonator in the second stage having a short resonator length, and releasing the first stage pulse again.

Provided that the Q switch resonator 10 in the first stage has a round-trip length of L1 and the Q switch resonator 20 in the second stage has a round-trip length of L2, in a range where a switching speed of the Q switch is negligible, a compression rate of a pulse width is determined by a ratio L2/L1 of the round-trip lengths in the first stage and the second stage.

Figure 10:
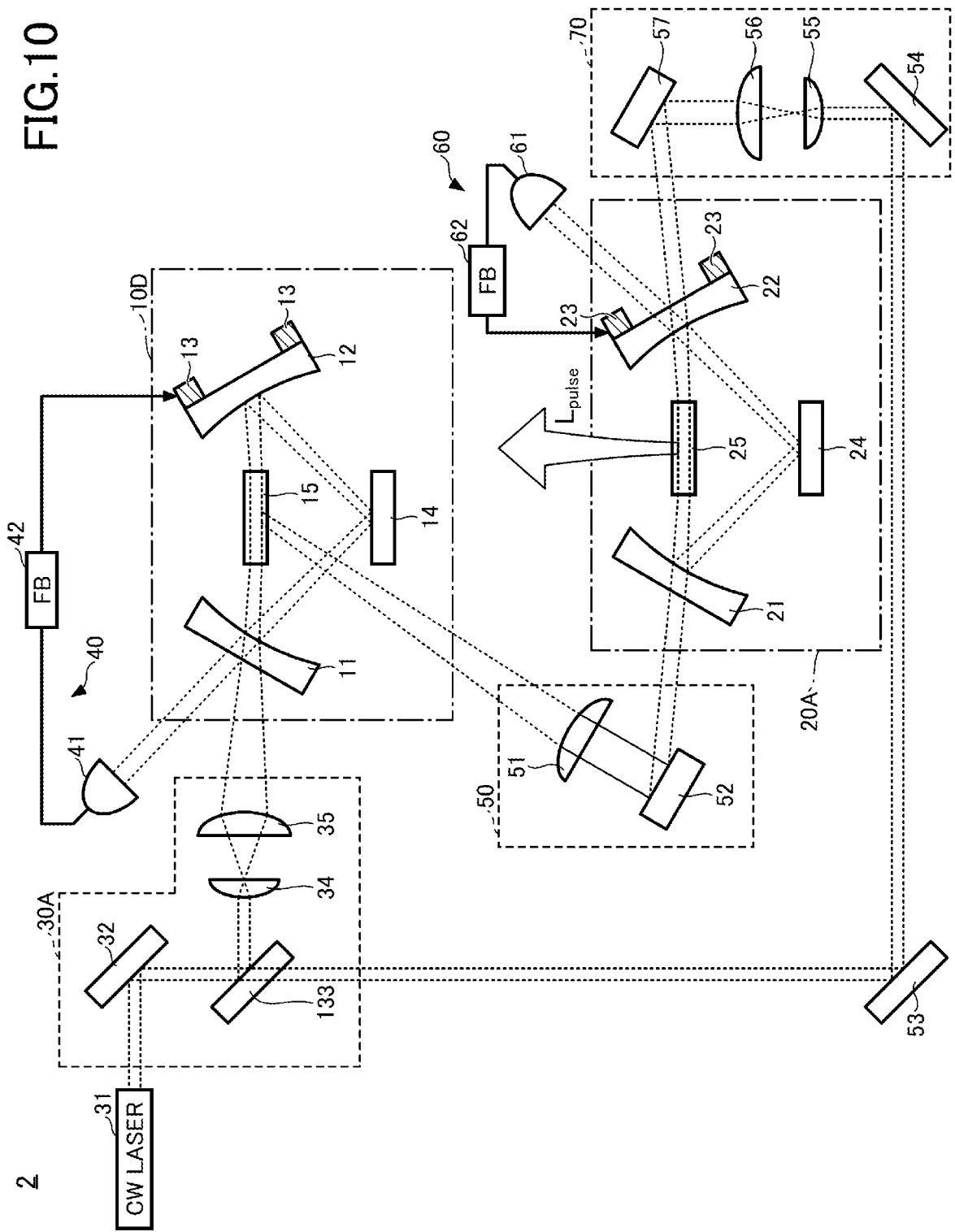
FIG. 10 is a configuration example of the pulse generator according to the second embodiment.

FIG. 10 is a configuration example of the pulse generator 2. The pulse generator 2 includes a CW laser 31, a Q switch resonator 10D in a first stage on which a CW wave output from the CW laser 31 is incident, and a Q switch resonator 20A in a second stage to which an output pulse of the Q switch resonator 10D is input.

In this example, the Q switch resonator 10D constitutes a triangular ring-type optical resonator with mirrors 11, 12, and 14, and a Q switch 15 is provided in the optical resonator. Any of the mirrors 11, 12, and 14 may be provided with an actuator 13 for adjusting a round-trip length of the resonator.

The Q switch resonator 20A in the second stage constitutes a triangular ring-type optical resonator with mirrors 21, 22, and 24, and a Q switch 25 is provided in the optical resonator. Any of the mirrors 21, 22, and 24 may be provided with an actuator 23 for adjusting a round-trip length of the resonator.

Output light of the CW laser 31 is input to the Q switch resonator 10D in the first stage by an optical system 30A for a lateral mode adjustment. The optical system 30A for a lateral mode adjustment includes, for example, a mirror 32, a beam splitter 133, a lens 34, and a lens 35. The beam splitter 133 guides a portion of incident light to the lens 34, and guides another portion of the incident light to a mirror 53. The light incident on the lens 34 passes through the lens 35 and is incident on the Q switch resonator 10D in the first stage with a lateral mode of the incident light being adjusted.

A resonator length of the Q switch resonator 10D is adjusted by a feedback system 40 to match with an integral multiple of a wavelength of the CW laser 31.

An optical pulse output from the Q switch resonator 10D in the first stage is input to the Q switch resonator 20A in the second stage by an optical system 50 for a lateral mode adjustment. The optical system 50 is formed of a lens 51 and a mirror 52 as an example, but is not limited to this example.

The optical pulse amplified and compressed by the Q switch resonator 20A in the second stage is extracted to the outside by a Q switch 25.

A portion of the output of the CW laser 31 is guided by the mirror 53 to an optical system 70 for a longitudinal mode adjustment of the Q switch resonator 20A. The optical system 70 for a longitudinal mode adjustment includes, for example, mirrors 54 and 57 and lenses 55 and 56, but is not limited to this example.

Light input from the optical system 70 for a longitudinal mode adjustment to the Q switch resonator 20A and reflected by the mirror 22 is monitored by a photodetector 61 of a feedback system 60. More specifically, the photodetector 61 is configured to monitor interference light of the output light of the CW laser 31 guided by the optical system 70 and a portion of the light that makes a round-trip in the Q switch resonator 20A. The feedback circuit 62 is configured to control the actuator 23 or the CW laser 31 such that a resonator length of the Q switch resonator 20A matches an integral multiple of a wavelength of the CW laser 31, based on information about the interference light.

Figure 11:
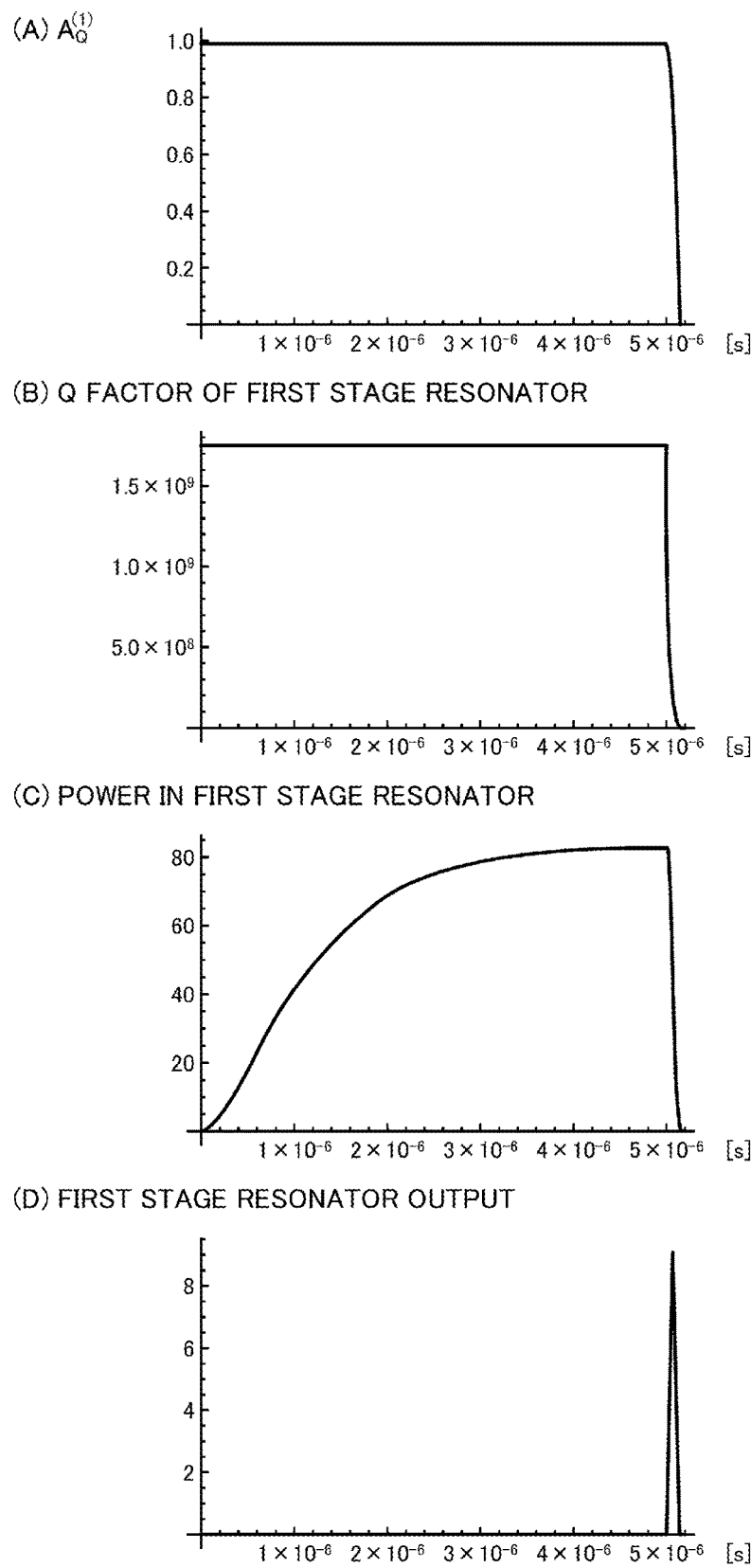
FIGS. 11A to 11D are graphs illustrating characteristics of a first stage resonator.
Figure 12:
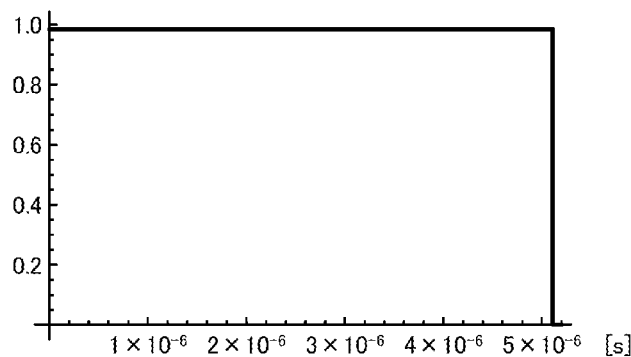
FIGS. 12A to 12C are graphs illustrating characteristics of a second stage resonator.
Figure 12:
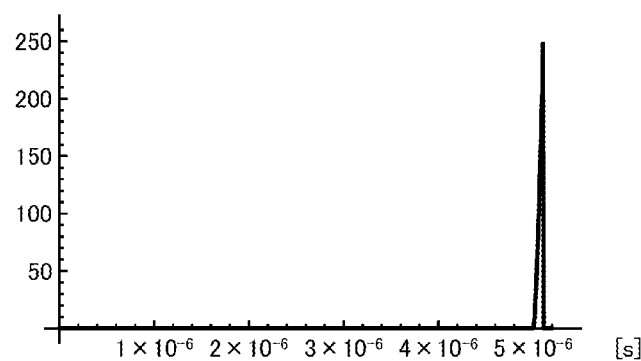
Figure 12:
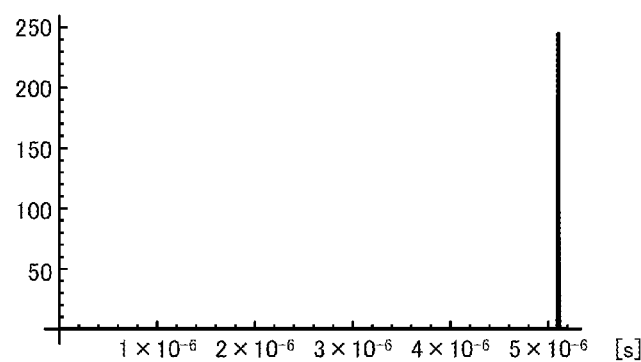

FIGS. 11A to 11D and FIGS. 12A to 12C are graphs illustrating resonator characteristics of the second embodiment. FIGS. 11A to 11D illustrate characteristics of a first stage resonator, and FIGS. 12A to 12C illustrate characteristics of a second stage resonator. Parameters of a simulation are set as follows:

The CW laser 31 has a power of 1 W, and a wavelength of 450 nm.

A round-trip length of the first stage resonator is 3 m, a reflectance of the mirror 11 is 98.8%, a reflectance of the mirror 12 is 99.9%, and a reflectance of the mirror 14 is 99.9%.

The Q switch 15 in the first stage has a maximum transmittance $A_Q^{MAX(1)}$ of 99%, and a response speed $\tau_Q$ of 1 nanosecond.

A round-trip length of the second stage resonator is 0.3 m, a reflectance of the mirror 21 is 99.9%, a reflectance of the mirror 22 is 98.8%, and a reflectance of the mirror 24 is 99.9%.

The Q switch 25 in the second stage has a maximum transmittance $A_Q^{MAX(2)}$ of 99%, and a response speed $\tau_Q$ of 1 nanosecond.

A round-tip length of the first stage resonator and the second stage resonator is controlled to be an integral multiple of a wavelength of the CW laser 31. A calculation starts from a state in which power in the resonator is 0.

Switching of the Q switch 15 to extract an optical pulse from the Q switch resonator 10D in the first stage is preferably performed slower than that in the first embodiment. This will be described below.

FIG. 11A illustrates a transmittance $A_Q^{(1)}$ of the Q switch 15 in the first stage, FIG. 11B illustrates a Q factor of the first stage resonator, FIG. 11C illustrates power in the first stage resonator, and FIG. 11D illustrates a pulse output of the first stage resonator. An initial value of $A_Q^{(1)}$ of the Q switch 15 in the first stage is the maximum value $A_Q^{MAX}$ ($A_Q^{MAX}=0.99$), and thus the Q factor is set high.

The power accumulated in the first stage resonator gradually increases from a start of incidence. When the power in the first stage resonator approaches a steady value, the $A_Q^{(1)}$ value is lowered to 0 for a time of about 8.5 nanoseconds to extract pulse light in the first stage. The Q factor of the first stage resonator and the power in the resonator decrease slower than those in the first embodiment, and a pulse output in the first stage is obtained. A pulse width of the pulse output is wider than that in the first embodiment.

In FIG. 12A, an initial value of $A_Q^{(2)}$ of the Q switch 25 in the second stage is the maximum value (0.99), and the Q factor is set high from the beginning. In FIG. 12B, the power in the second stage resonator rapidly rises immediately after an input of the first stage pulse. When the power in the second stage resonator reaches a peak, $A_Q^{(2)}$ is lowered to 0 for a time of about 1 nanosecond to extract a pulse of interest. The power in the second stage resonator decreases at once, and the short pulse in FIG. 12C is acquired.

Figure 13:
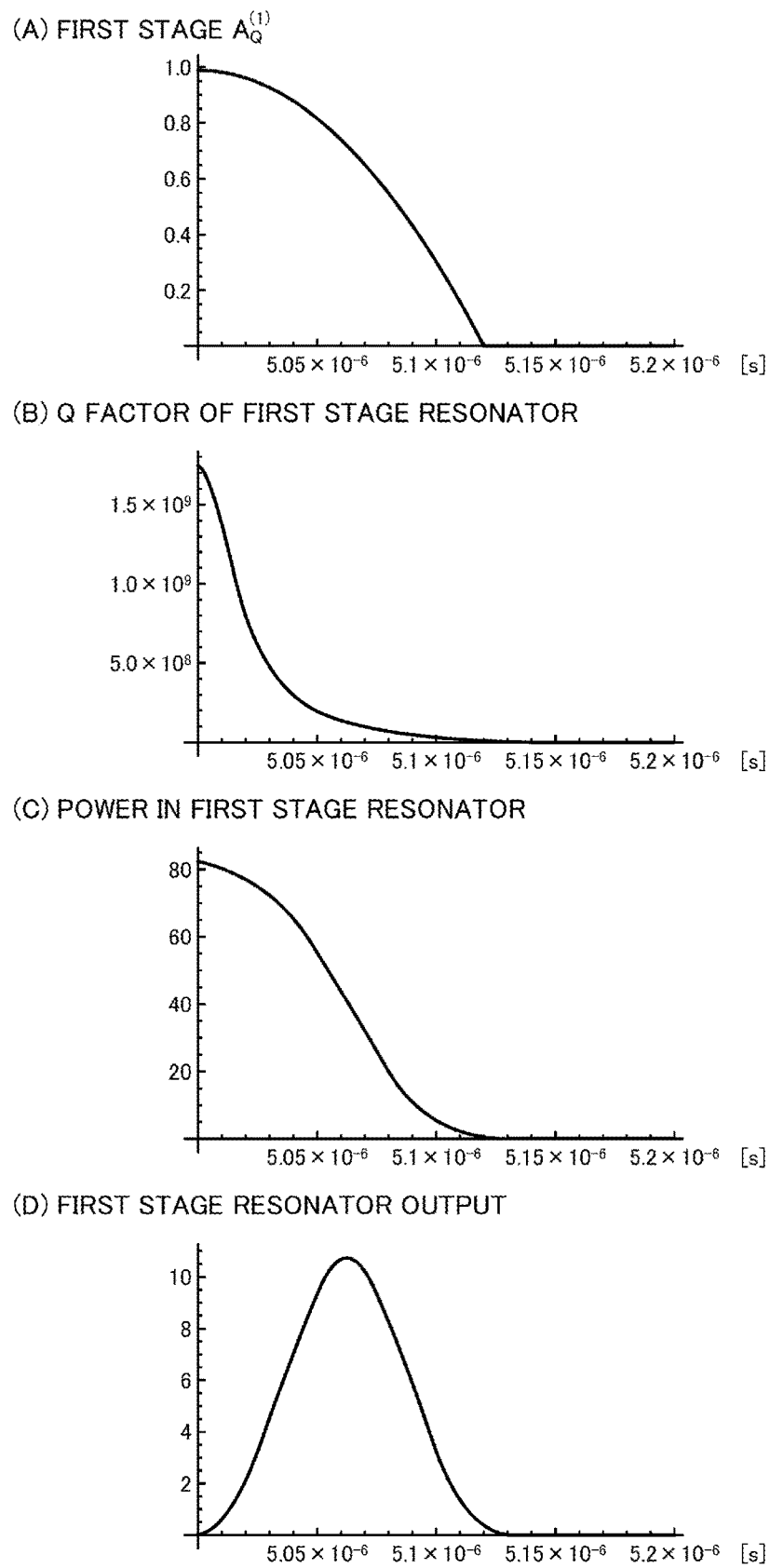
FIGS. 13A to 13D are enlarged views near pulse output points of the first stage resonator.

FIGS. 13A to 13D and FIGS. 14A to 14C are enlarged views near 5 microseconds in FIGS. 11A to 11D and FIGS. 12A to 12C. Corresponding to FIGS. 11A to 11D and FIGS. 12A to 12C, FIG. 13A illustrates a transmittance $A_Q^{(1)}$ in the first stage, FIG. 13B illustrates a Q factor of the first stage resonator, FIG. 13C illustrates power in the first stage resonator, and FIG. 13D illustrates a first stage pulse output.

The $A_Q^{(1)}$ value in the first stage is lowered to 0 over a time of about 110 nanoseconds, and accordingly both the Q factor in the first stage and the power in the first stage resonator decrease slowly as compared to FIGS. 8B and 8C. A pulse width of the first stage pulse output is about 90 nanoseconds. This value is longer than the pulse width of about 10 nanoseconds when the $A_Q^{(1)}$ value is immediately set to 0.

Figure 14:
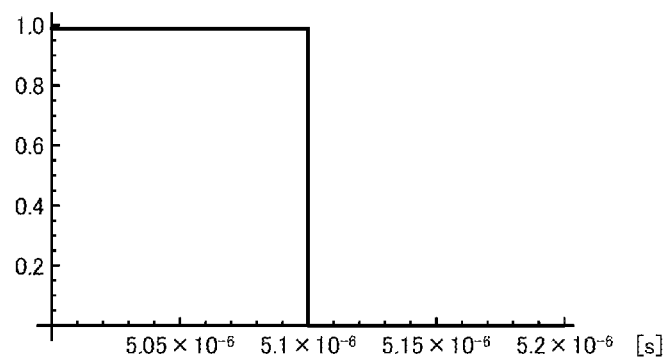
FIGS. 14A to 14C are enlarged views near pulse output points of the second stage resonator.
Figure 14:
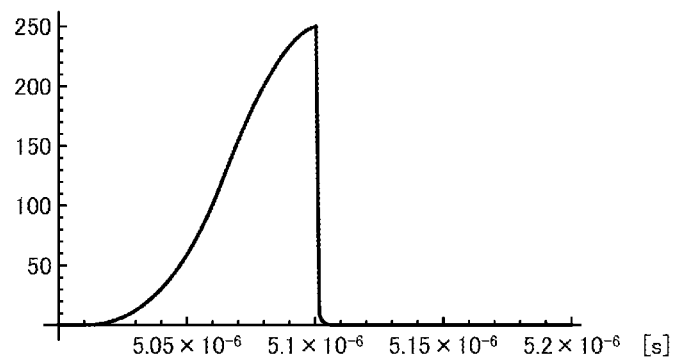
Figure 14:
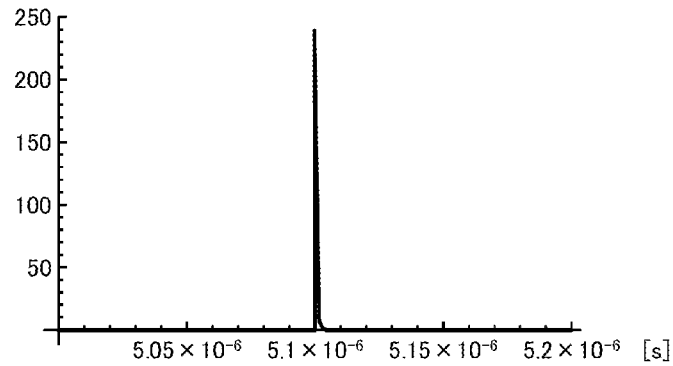

In FIGS. 14A and 14B, the transmittance $A_Q^{(2)}$ in the second stage is changed to 0 for a time of 1 nanosecond at a point in time when the power in the second stage resonator reaches a peak. The power in the second stage resonator decreases at once, and the short pulse in FIG. 14C is acquired. This short pulse is output at a maximum output of 246 W immediately after the Q switch 25 in the second stage is switched, and becomes a half value after about 0.8 nanoseconds from the output.

Thus, the output pulse of the Q switch resonator 10D in the first stage is input to the Q switch resonator 20A in the second stage, which allows for obtaining an ultra-short pulse having higher peak power.

Figure 15:
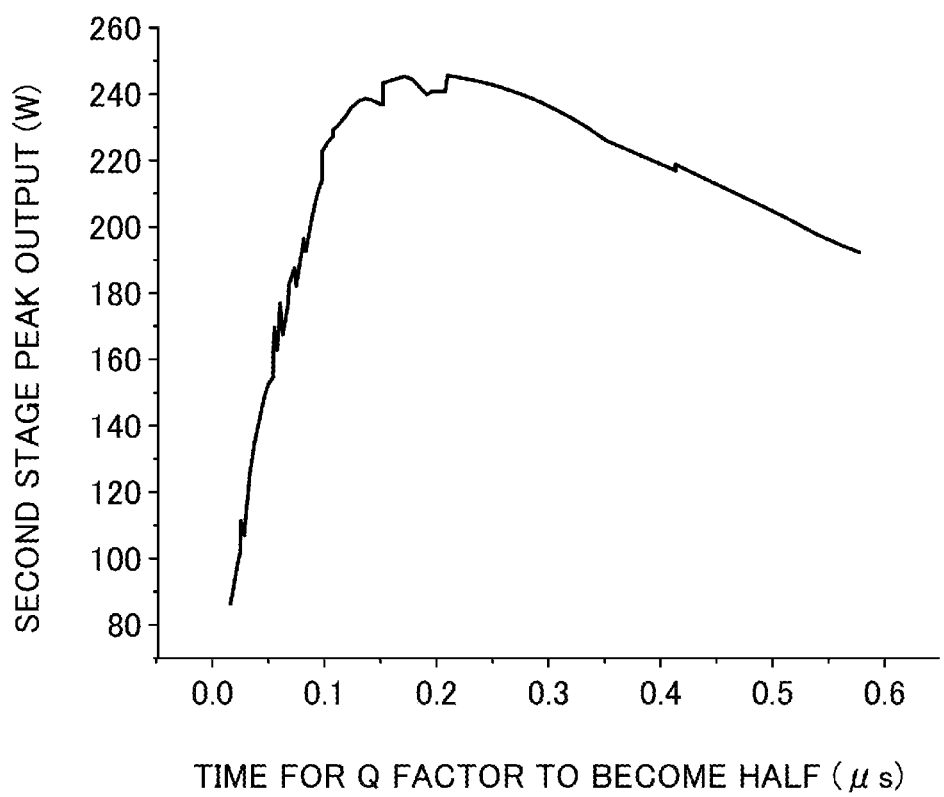
FIG. 15 is a graph illustrating a Q factor switching speed of the first stage resonator.

FIG. 15 is a graph illustrating a Q factor switching speed of the first stage resonator. In general, upon incidence of pulse light on the optical resonator, coupling efficiency is 100% when rise of a pulse waveform is an exponential function with a life (i.e., light confinement time) of the optical resonator as a time constant and instantly reaches 0 immediately after achieving peak power, coupling efficiency of 100% is obtained.

In contrast, a pulse waveform emitted when the Q switch of the optical resonator in the first stage is instantly switched has a peak power achieved instantly from 0 and then exponentially falls with a life of the optical resonator in the first stage as a time constant (see FIG. 8D). This waveform has a shape that is obtained by inverting the ideal pulse shape described above in terms of time and changing the time constant. With such a pulse waveform, the coupling efficiency to the second stage optical resonator is insufficient.

Thus, as illustrated in FIG. 13A, by slowly lowering the transmittance $A_Q^{(1)}$ in the first stage to 0, rise of the pulse light from the first stage (see FIG. 13D) approaches the life of the second stage resonator and the coupling efficiency improves.

In FIG. 15, a horizontal axis is the time for the Q factor of the first stage resonator to become half, and a vertical axis is a peak value of the output pulse of the second stage resonator. The Q factor is changed with a convex upward quadratic function in the example herein, but may be changed with another appropriate function. It can be understood that the coupling efficiency can be optimum by appropriately selecting the time to lower the Q factor.

Third Embodiment

Figure 16:
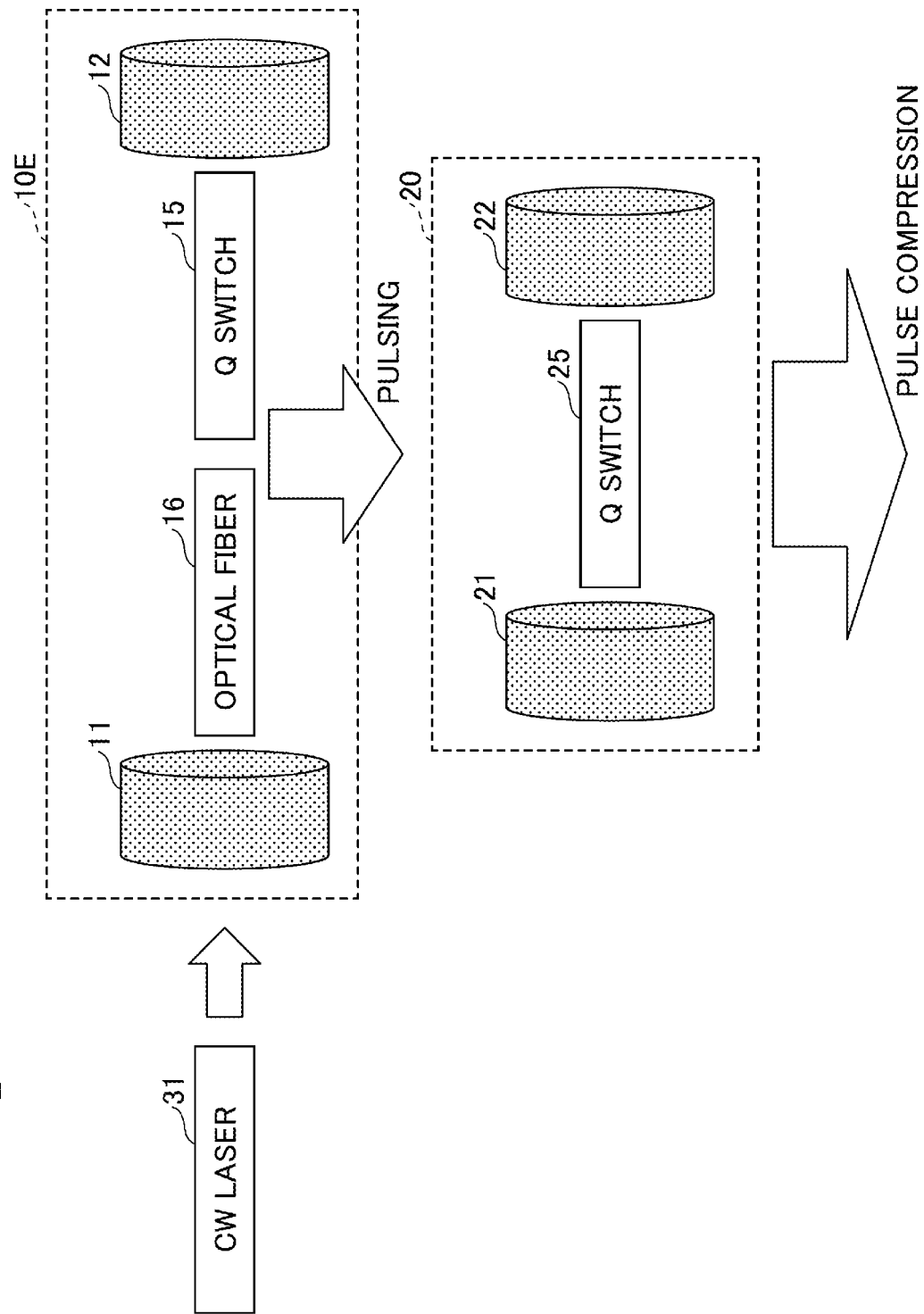
FIG. 16 is a schematic diagram of a pulse generator according to a third embodiment.

FIG. 16 is a schematic diagram of a pulse generator 3 according to a third embodiment. In the third embodiment, a resonator length (a round-trip length L1) in a first stage is set long by using an optical fiber, and a pulse width of a first stage output pulse is widened. A longer resonator length can be set in a space-saving manner by using the optical fiber. The pulse width of the output pulse of the first stage resonator is widened to increase energy of light incident on a second stage resonator, and pulse light having high peak power is extracted from the second stage resonator.

The pulse generator 3 includes a Q switch resonator 10E in the first stage, and a Q switch resonator 20 in the second stage to which a pulse output from the Q switch resonator 10E is input. The Q switch resonator 10E in the first stage includes a mirror 11, a mirror 12, an optical fiber 16, and a Q switch 15. The optical fiber 16 is used for at least a portion of an optical path between the mirror 11 and the mirror 12, and is configured to resonate light.

Figure 17:
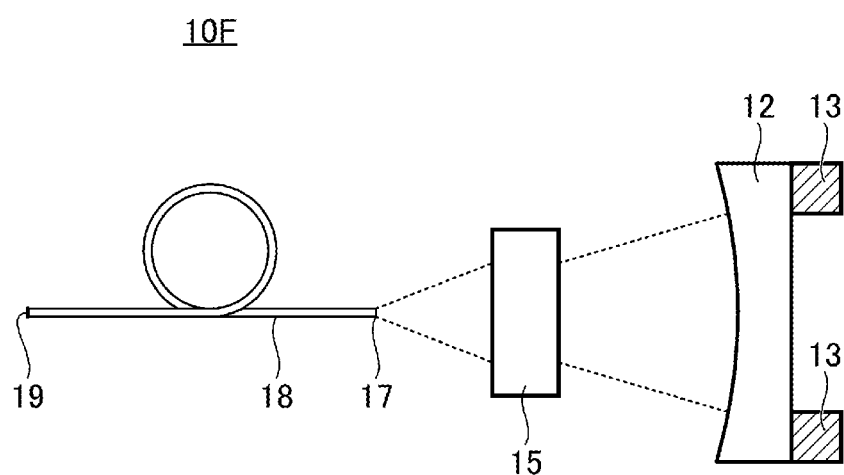
FIG. 17 is a configuration example of a first stage resonator in the configuration in FIG. 16.

FIG. 17 is a configuration example of the first stage resonator used in the pulse generator 3 in FIG. 16. A Q switch resonator 10F includes an optical fiber 18, the mirror 12, and the Q switch 15. A reflective surface 19 is formed on one end side of the optical fiber 18 by applying a reflective coating, for example. The reflective surface 19 also serves as an incident surface of CW light. Another end 17 of the optical fiber 18 serves as an emission end to the mirror 12.

The reflective surface 19 of the optical fiber 18 and the mirror 12 constitute an optical resonator. The mirror 12 may be provided with an actuator 13 for adjusting a round-trip length of the resonator to an integral multiple of a wavelength of a CW laser 31. Light incident on the optical fiber 18 is repeatedly reflected and is amplified between the mirror 12 and the reflective surface 19. While energy is stored in the resonator, the Q factor of the resonator is maintained high. When the energy in the resonator approaches a steady value, the Q factor is switched to a low side and pulse light is output from the resonator. At this time, it is preferable to control the switching time of the Q factor to improve the coupling efficiency to the second stage resonator.

Figure 18:
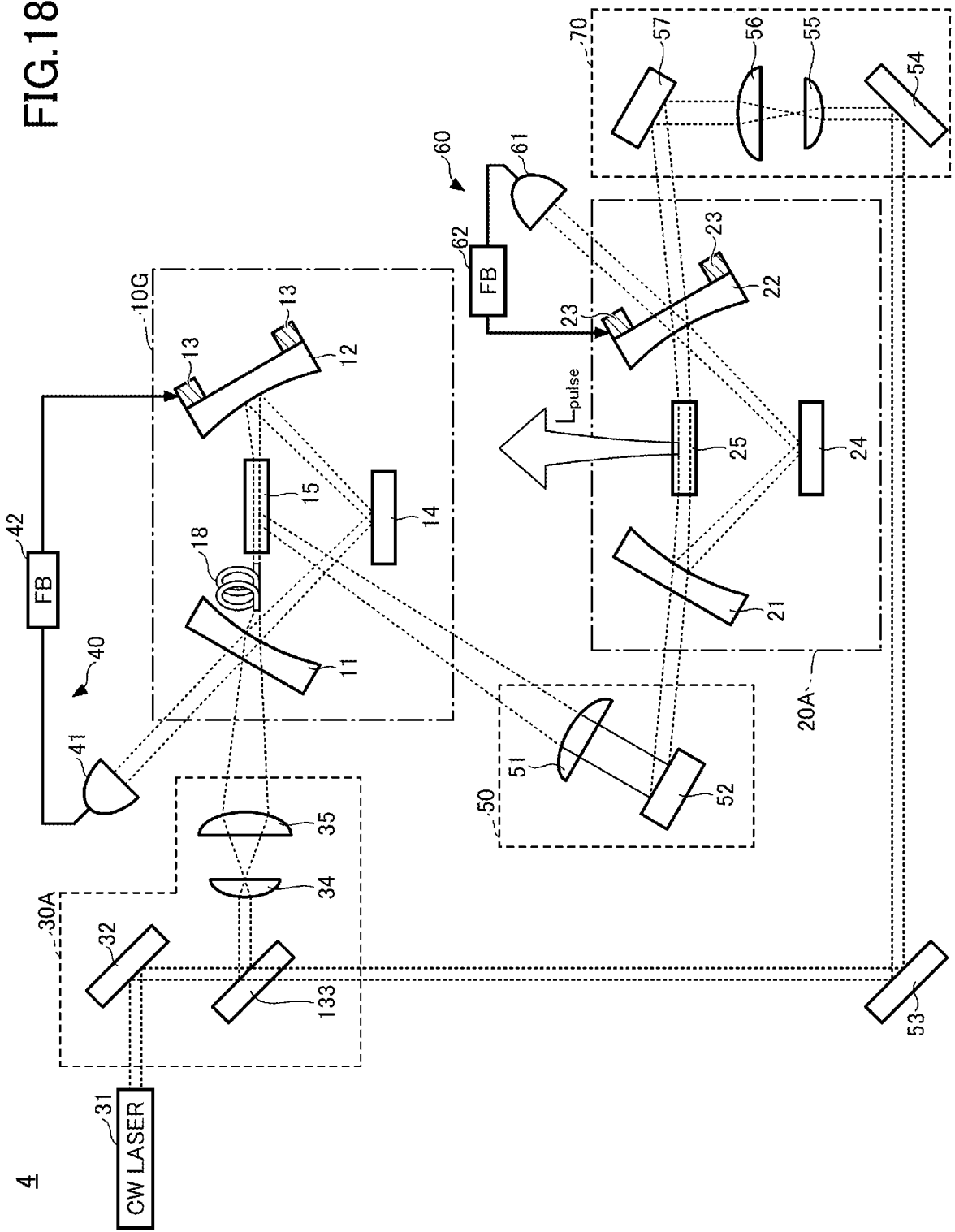
FIG. 18 is a configuration example of the pulse generator according to the third embodiment.

FIG. 18 is a configuration example of a pulse generator 4 having the configuration in FIG. 16. The configuration of the pulse generator 4 is substantially the same as that of the pulse generator 2 in FIG. 10, but is different in that a Q switch resonator 10G in the first stage uses an optical fiber 18.

The Q switch resonator 10G constitutes a triangular ring-type optical resonator with mirrors 11, 12, and 14 and the optical fiber 18, and a Q switch 15 is provided in the optical resonator. In this configuration example, no reflective coating is applied to the end surfaces of the optical fiber 18, and an adjustment is made such that incident CW light or resonating reflected light is condensed on an end surface of the optical fiber 18 using a curvature of the mirror 11. Any of the mirrors 11, 12, and 14 may be provided with the actuator 13 for adjusting a round-trip length of the resonator.

An output pulse of the Q switch resonator 10G is input to a Q switch resonator 20A in the second stage by an optical system 50 for a lateral mode adjustment. When energy stored in the Q switch resonator 20A approaches a steady value, the Q switch 25 switches the Q factor of the resonator to a low side and outputs a shorter optical pulse having higher peak power than the first stage output.

Figure 19:
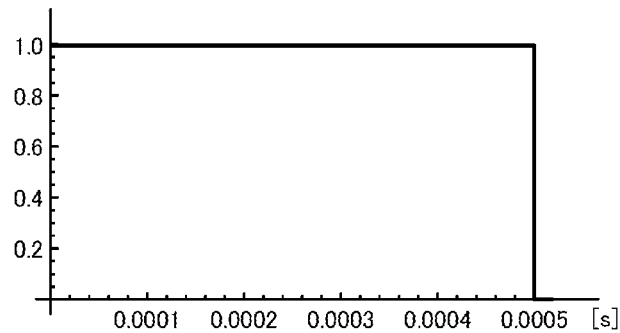
FIGS. 19A to 19D are graphs illustrating characteristics of a first stage resonator according to the third embodiment.
Figure 19:
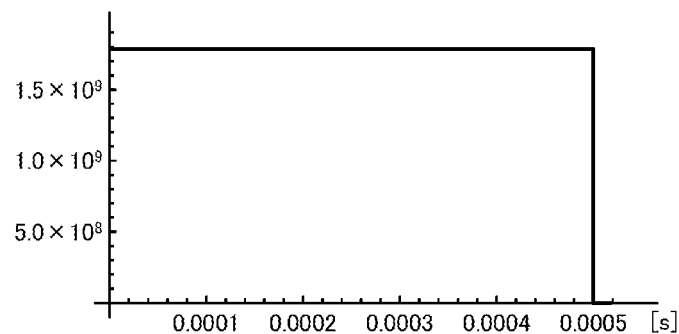
Figure 19:
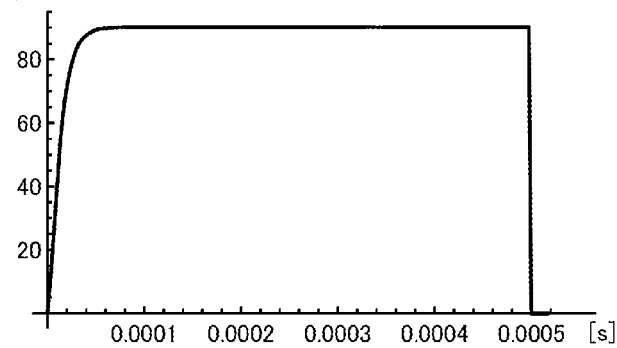
Figure 19:
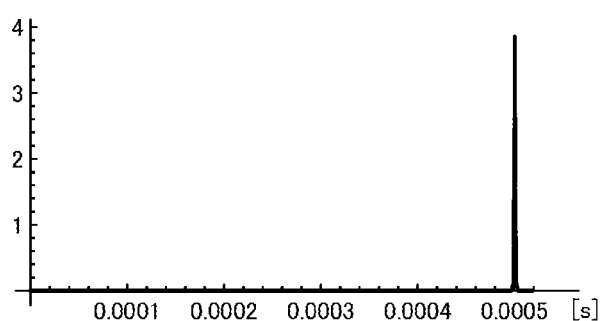
Figure 20:
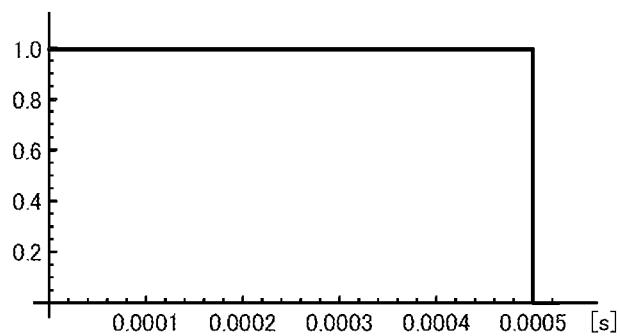
FIGS. 20A to 20C are graphs illustrating characteristics of a second stage resonator according to the third embodiment.
Figure 20:
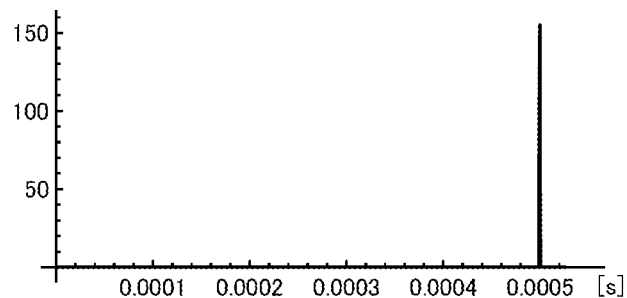
Figure 20:
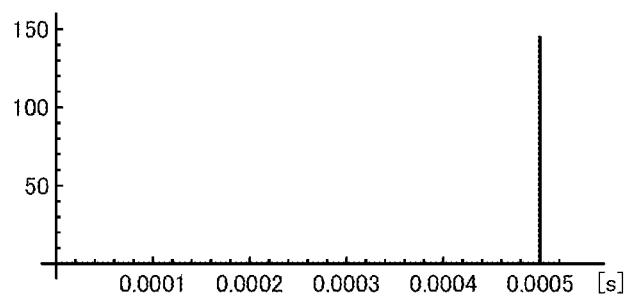

FIGS. 19A to 19D and FIGS. 20A to 20C are graphs illustrating resonator characteristics of the third embodiment. FIGS. 19A to 19D illustrate characteristics of the first stage resonator, and FIGS. 20A to 20C illustrate characteristics of the second stage resonator. Parameters of a simulation are set as follows:

The CW laser 31 has a power of 1 W, and a wavelength of 450 nm.

A round-trip length of the first stage resonator including the optical fiber 18 is 300 m, a reflectance of the mirror 11 is 89%, a reflectance of the mirror 12 is 99.9%, and a reflectance of the mirror 14 is 99.9%.

The Q switch 15 in the first stage has a maximum transmittance $A_Q^{MAX(1)}$ of 99%, and a response speed $\tau_Q$ of 1 nanosecond.

A round-trip length of the second stage resonator is 3 m, a reflectance of the mirror 21 is 99.9%, a reflectance of the mirror 22 is 98.8%, and a reflectance of the mirror 24 is 99.9%.

The Q switch 25 in the second stage has a maximum transmittance $A_Q^{MAX(2)}$ of 99%, and a response speed $\tau_Q$ of 1 nanosecond.

A resonator length of the first stage resonator and the second stage resonator is controlled to be an integral multiple of a wavelength of the CW laser 31.

FIG. 19A illustrates a transmittance $A_Q^{(1)}$ of the Q switch 15 in the first stage, FIG. 19B illustrates a Q factor of the first stage resonator, FIG. 19C illustrates power in the first stage resonator, and FIG. 19D illustrates a pulse output of the first stage resonator. An initial value of $A_Q^{(1)}$ of the Q switch 15 in the first stage is set to the maximum value (0.99).

The power accumulated in the first stage resonator gradually increases from a start of incidence. When the power in the first stage resonator approaches a steady value, the $A_Q^{(1)}$ value is lowered to 0 for a time of about 1 microsecond to extract pulse light in the first stage. The Q factor of the first stage resonator and the power in the resonator decrease slower than those in the first embodiment, and a pulse output in the first stage is acquired.

In FIG. 20A, an initial value of $A_Q^{(2)}$ of the Q switch 25 in the second stage is the maximum value (0.99), and the Q factor is set high from the beginning. In FIG. 20B, the power in the second stage resonator rapidly rises immediately after an input of the first stage pulse. When the power in the second stage resonator reaches a peak, $A_Q^{(2)}$ is lowered to 0 for a time of 1 nanosecond to extract a pulse of interest. The power in the second stage resonator decreases at once, and the short pulse in FIG. 20C is obtained.

Figure 21:
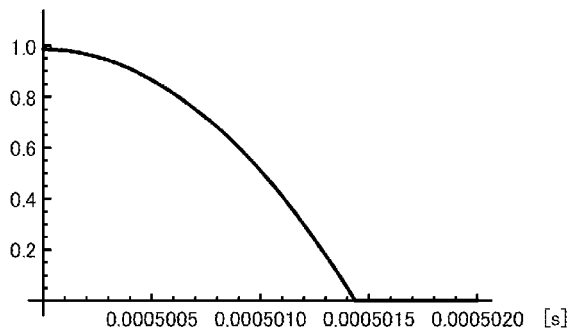
FIGS. 21A to 21D are enlarged views near pulse output points of the first stage resonator according to the third embodiment.
Figure 21:
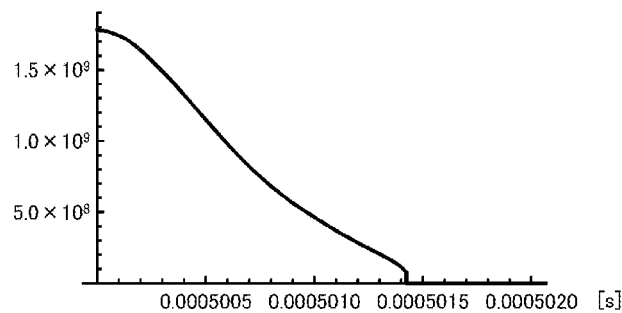
Figure 21:
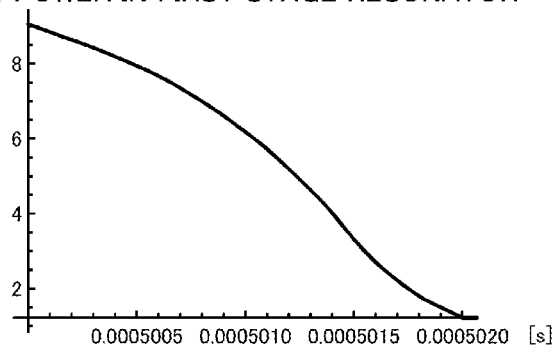
Figure 21:
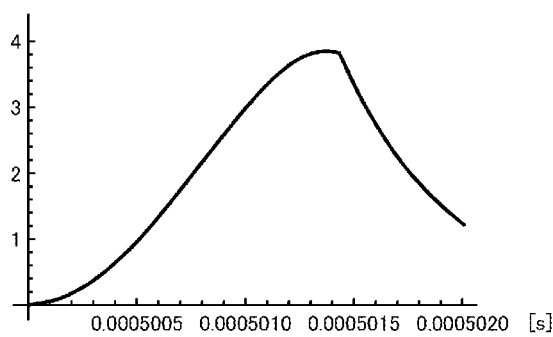

FIGS. 21A to 21D and FIGS. 22A to 22C are enlarged views near 500 microseconds in FIGS. 19A to 19D and FIGS. 20A to 20C. Corresponding to FIGS. 19A to 19D and FIGS. 20A to 20C, FIG. 21A illustrates a transmittance $A_Q^{(1)}$ in the first stage, FIG. 21B illustrates a Q factor of the first stage resonator, FIG. 21C illustrates power in the first stage resonator, and FIG. 21D illustrates a first stage pulse output.

A pulse width when the $A_Q^{(1)}$ value is immediately set to 0 is 350 nanoseconds, but in this example, the $A_Q^{(1)}$ value in the first stage is slowly lowered to 0 over a period of time of approximately 1 microsecond, and thus a pulse width of the first stage pulse output is about 1 microsecond, which is long.

Figure 22:
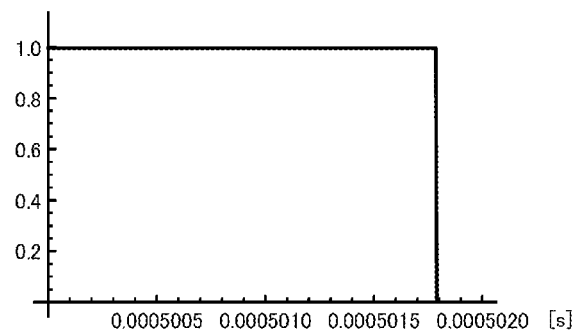
FIGS. 22A to 22C are enlarged views near pulse output points of the second stage resonator according to the third embodiment.
Figure 22:
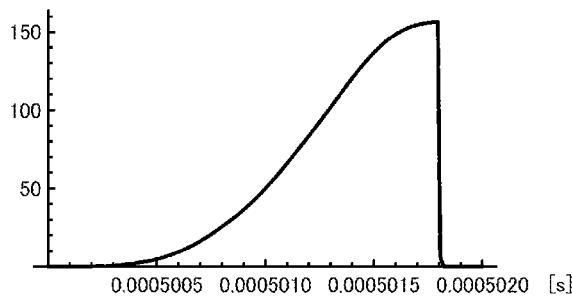
Figure 22:
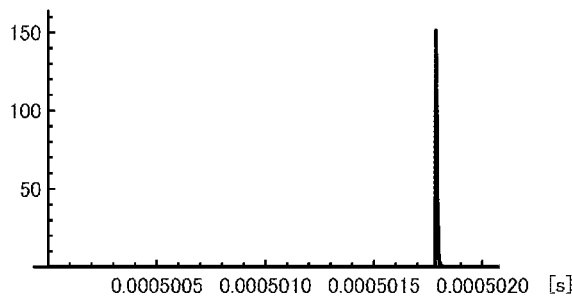

In FIGS. 22A and 2B, the transmittance $A_Q^{(2)}$ in the second stage is changed to 0 for a time of 1 nanosecond at a point in time when the power in the second stage resonator reaches a peak. The power in the second stage resonator decreases at once, and the pulse in FIG. 22C is acquired. This pulse is output at a maximum output of 154 W immediately after the Q switch 25 in the second stage is switched, and becomes a half value after about 4 nanoseconds from the output.

Thus, by using the optical fiber in the Q switch resonator 10D in the first stage and inputting the output pulse of the Q switch resonator 10D to the Q switch resonator 20A in the second stage, a short pulse having high peak power can be obtained. In the third embodiment, although there is a slight light loss to the fiber or from the fiber due to an input/output, a round-trip length of the resonator can be set long, and a degree of freedom in design is high, such as allowing generation of a pulse having high energy per pulse in a relatively space-saving manner.

The present invention is described above based on specific examples, but the present invention is not limited to the configuration examples described above. For example, an optical resonator constituting a Q switch resonator is not limited to a resonator using two mirrors or three mirrors, but may be a bow tie-type resonator using four mirrors. Also in this case, a part of the mirrors constituting the optical resonator may be used as a Q switch. Further, an optical fiber may be applied to at least a portion of the optical resonator.

An adjustment of single lateral mode and/or an adjustment of single longitudinal mode between a CW light source and an optical resonator is not limited to the illustrated examples, and an appropriate control mechanism may be adopted depending on an arrangement configuration of the optical resonator.

In all of the first to third embodiments, a pulse can be effectively generated from an inexpensive CW light source having low power consumption and having a desired wavelength, such as a semiconductor laser and a fiber laser. The pulse generators according to the embodiments can be applied in a variety of fields, including cutting, processing, optical measurement, optical excitation, and the like of a special material. Further, because the Q switch resonator does not use a gain medium therein, the problem of light damage can be avoided. At least one of the mirrors constituting the Q switch resonator may be used as a Q switch. In this case, the number of components is further reduced, and switching control of a Q factor is also facilitated.

DENOTATIONS OF REFERENCE NUMERALS 1, 2, 3, 4 Pulse generator
10, 10A to 10G Q switch resonator
11, 12, 14 Mirror
13 Actuator
18 Optical fiber
20, 20A Q switch resonator in second stage
30, 30A, 50 Optical system for lateral mode adjustment
31 CW laser
40, 60 Feedback system
70 Optical system for longitudinal mode adjustment
110 Optical resonator

What is claimed is:
1. A Q switch resonator, comprising:
an optical resonator comprising at least two mirrors, and configured to accumulate power of a continuous wave or an intermittent continuous wave incident from an outside, wherein the optical resonator does not contain a gain medium; and
a switching element provided in the optical resonator, wherein:

the switching element is configured such that, when the power accumulated in the optical resonator increases to a predetermined level, the switching element outputs an optical pulse by lowering a Q factor from a first level to a second level lower than the first level.

2. The Q switch resonator according to claim 1, wherein: when the power approaches a steady value or reaches a steady value, the switching element switches the Q factor to the second level.

3. The Q switch resonator according to claim 1, wherein: the switching element is a part of the at least two mirrors of the optical resonator.

4. The Q switch resonator according to claim 1, wherein: the switching element is a mechanical, acoustic, or electro-optical Q switch.

5. A pulse generator, comprising:
a first optical resonator, wherein the first optical resonator does not contain a gain medium; and
a light source configured to cause a continuous wave or an intermittent continuous wave to be incident on the first optical resonator, wherein:
the first optical resonator comprises a first switching element, and
the first switching element is configured such that, when power of light incident on the first optical resonator increases to a predetermined level, the first switching element outputs an optical pulse by lowering a Q factor of the first optical resonator from a first level to a second level lower than the first level.

6. The pulse generator according to claim 5, wherein: the light source is a continuous wave laser of a single longitudinal/lateral mode.

7. The pulse generator according to claim 5, wherein: the light source is a semiconductor laser or a fiber laser.

8. The pulse generator according to claim 5, further comprising:
a second optical resonator connected to an output of the first optical resonator, wherein:
a resonator length of the second optical resonator is shorter than a resonator length of the first optical resonator.

9. The pulse generator according to claim 8, wherein: the second optical resonator comprises a second switching element.

10. The pulse generator according to claim 9, wherein: the second switching element is configured such that, when power of light incident on a cavity of the second optical resonator increases to a predetermined level, the second switching element outputs a second optical pulse by lowering a Q factor of the second optical resonator from a third level to a fourth level lower than the third level.

11. The pulse generator according to claim 10, wherein: the second optical pulse output from the second optical resonator has peak power higher than that of the optical pulse output from the first optical resonator.

12. The pulse generator according to claim 8, wherein: the first switching element is configured such that, when a Q factor of the first optical resonator is lowered from the first level to the second level, the first switching element switches a Q factor of the first optical resonator so as to generate an exponentially increasing pulse waveform with a life of the second optical resonator as a time constant.

13. The pulse generator according to claim 5, wherein: at least a portion of an optical path in the first optical resonator is formed of an optical fiber.

14. The pulse generator according to claim 5, wherein: the first switching element is a part of a mirror of the first optical resonator.

15. The pulse generator according to claim 5, wherein: the first switching element is a mechanical, acoustic, or electro-optical Q switch.

16. The pulse generator according to claim 9, wherein: the second switching element is a part of a mirror of the second optical resonator.

17. The pulse generator according to claim 9, wherein: the second switching element is a mechanical, acoustic, or electro-optical Q switch.

18. A pulse generator, comprising:
a first optical resonator;
a light source configured to cause a continuous wave or an intermittent continuous wave to be incident on the first optical resonator; and
a second optical resonator connected to an output of the first optical resonator, wherein:
the first optical resonator comprises a first switching element, and
the first switching element is configured such that, when power of light incident on the first optical resonator increases to a predetermined level, the first switching element outputs an optical pulse by lowering a Q factor of the first optical resonator from a first level to a second level lower than the first level, and
a resonator length of the second optical resonator is shorter than a resonator length of the first optical resonator.

19. The pulse generator according to claim 18, wherein: the second optical resonator comprises a second switching element.

20. The pulse generator according to claim 19, wherein: the second switching element is configured such that, when power of light incident on a cavity of the second optical resonator increases to a predetermined level, the second switching element outputs a second optical pulse by lowering a Q factor of the second optical resonator from a third level to a fourth level lower than the third level.

21. The pulse generator according to claim 20, wherein: the second optical pulse output from the second optical resonator has peak power higher than that of the optical pulse output from the first optical resonator.

22. The pulse generator according to claim 18, wherein: the first switching element is configured such that, when a Q factor of the first optical resonator is lowered from the first level to the second level, the first switching element switches a Q factor of the first optical resonator so as to generate an exponentially increasing pulse waveform with a life of the second optical resonator as a time constant.

23. The pulse generator according to claim 19, wherein: the second switching element is a part of a mirror of the second optical resonator.

24. The pulse generator according to claim 19, wherein: the second switching element is a mechanical, acoustic, or electro-optical Q switch.

* * * * *